United States Patent
Nozawa

(10) Patent No.: US 10,903,264 B2
(45) Date of Patent: Jan. 26, 2021

(54) IMAGING SYSTEM AND IMAGING METHOD

(71) Applicant: Panasonic Intellectual Property Management Co., Ltd., Osaka (JP)

(72) Inventor: Katsuya Nozawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 36 days.

(21) Appl. No.: 16/447,147

(22) Filed: Jun. 20, 2019

(65) Prior Publication Data

US 2019/0312080 A1    Oct. 10, 2019

Related U.S. Application Data

(63) Continuation of application No. PCT/JP2017/035898, filed on Oct. 3, 2017.

(30) Foreign Application Priority Data

Feb. 28, 2017 (JP) ................. 2017-037274

(51) Int. Cl.
*H04N 5/349* (2011.01)
*H01L 27/148* (2006.01)
(Continued)

(52) U.S. Cl.
CPC .......... *H01L 27/14812* (2013.01); *G06T 7/73* (2017.01); *H01L 27/142* (2013.01);
(Continued)

(58) Field of Classification Search
CPC .................................................... H04N 5/349
(Continued)

(56) References Cited

U.S. PATENT DOCUMENTS

| 2007/0076108 A1 | 4/2007 | Misawa |
| 2010/0013969 A1 | 1/2010 | Ui |

(Continued)

FOREIGN PATENT DOCUMENTS

| JP | 58-182265 | 10/1983 |
| JP | 2007-104114 | 4/2007 |

(Continued)

OTHER PUBLICATIONS

International Search Report of PCT application No. PCT/JP2017/035898 dated Nov. 21, 2017.

*Primary Examiner* — Joel W Fosselman
(74) *Attorney, Agent, or Firm* — Renner, Otto, Boisselle & Sklar, LLP

(57) ABSTRACT

An imaging system includes an imaging optical system, an imaging device, an actuator, and control circuitry. The actuator changes a relative position of a plurality of pixel cells and an image of a subject. The pixel cells have variable sensitivity, and include a photoelectric converter and a charge accumulation region. The control circuitry sets the relative position to a first position, and also sets the sensitivity of each pixel cell to a first sensitivity. A first signal charge obtained at the photoelectric converter is accumulated in the charge accumulation region. The relative position is set to a second position different from the first position, and also the sensitivity of each pixel cell is set to a second sensitivity different from the first sensitivity. A second signal charge obtained at the photoelectric converter is accumulated in the charge accumulation region in addition to the first signal charge.

25 Claims, 23 Drawing Sheets

(51) Int. Cl.
*G06T 7/73* (2017.01)
*H01L 27/142* (2014.01)
*H04N 5/235* (2006.01)
*H04N 5/341* (2011.01)
*H04N 5/225* (2006.01)

(52) U.S. Cl.
CPC .......... *H04N 5/225* (2013.01); *H04N 5/2353* (2013.01); *H04N 5/341* (2013.01); *H04N 5/349* (2013.01)

(58) Field of Classification Search
USPC ....................................................... 348/311
See application file for complete search history.

(56) References Cited

U.S. PATENT DOCUMENTS

| 2010/0020205 A1 | 1/2010 | Ishida et al. |
| 2010/0079825 A1 | 4/2010 | Yamazaki et al. |
| 2011/0121162 A1 | 5/2011 | Murata et al. |
| 2011/0228149 A1 | 9/2011 | Naruse et al. |
| 2016/0344945 A1 | 11/2016 | Kano |

FOREIGN PATENT DOCUMENTS

| JP | 2008-172566 | | 7/2008 |
| JP | 2008-283705 | | 11/2008 |
| JP | 2010-028423 | | 2/2010 |
| JP | 2010-073035 | | 4/2010 |
| JP | 2010-087850 | | 4/2010 |
| JP | 2010073035 | * | 4/2010 |
| JP | 2011-199643 | | 10/2011 |
| JP | 2016-086407 | | 5/2016 |
| JP | 2016-192755 | | 11/2016 |
| JP | 2016-219974 | | 12/2016 |
| WO | 2001/063914 | | 8/2001 |
| WO | 2010/013417 | | 2/2010 |

* cited by examiner

| 1 | 0 | -1 |
|---|---|----|
| 2 | 0 | -2 |
| 1 | 0 | -1 |

FIG. 3

| 3 | 3 | 3 | 3 | 2 | 3 | 3 | 3 | 3 | 3 | 3 | 3 | 3 | 3 | 3 | 3 | 3 | 3 | 4 | 6 |
|---|---|---|---|---|---|---|---|---|---|---|---|---|---|---|---|---|---|---|---|
| 2 | 2 | 2 | 2 | 2 | 2 | 2 | 2 | 2 | 2 | 2 | 3 | 2 | 2 | 2 | 3 | 3 | 3 | 2 | 16 |
| 2 | 2 | 2 | 2 | 2 | 2 | 2 | 2 | 2 | 2 | 2 | 3 | 2 | 2 | 3 | 3 | 3 | 3 | 5 | 35 |
| 2 | 2 | 2 | 2 | 2 | 2 | 2 | 2 | 2 | 3 | 1 | 2 | 2 | 2 | 3 | 2 | 3 | 0 | 21 | 37 |
| 2 | 2 | 2 | 2 | 2 | 2 | 2 | 6 | 11 | 15 | 17 | 13 | 10 | 9 | 5 | 3 | 5 | 28 | 38 | 38 |
| 2 | 2 | 2 | 2 | 2 | 2 | 2 | 6 | 12 | 24 | 24 | 25 | 22 | 21 | 18 | 12 | 18 | 26 | 33 | 38 |
| 2 | 2 | 2 | 1 | 3 | 4 | 3 | 7 | 12 | 27 | 32 | 33 | 31 | 25 | 21 | 19 | 14 | 12 | 19 | 32 |
| 2 | 2 | 3 | 9 | 18 | 15 | 2 | 10 | 14 | 31 | 34 | 34 | 34 | 32 | 20 | 20 | 20 | 13 | 13 | 20 |
| 3 | 11 | 19 | 25 | 26 | 24 | 10 | 10 | 18 | 22 | 23 | 20 | 24 | 22 | 20 | 9 | 18 | 17 | 15 | 16 |
| 4 | 9 | 19 | 28 | 29 | 24 | 25 | 20 | 17 | 23 | 31 | 35 | 26 | 24 | 24 | 9 | 19 | 19 | 19 | 15 |
| 10 | 23 | 28 | 34 | 35 | 37 | 28 | 16 | 16 | 26 | 28 | 29 | 26 | 20 | 21 | 7 | 16 | 18 | 18 | 13 |
| 6 | 18 | 33 | 34 | 35 | 35 | 15 | 14 | 20 | 22 | 18 | 16 | 21 | 22 | 21 | 7 | 17 | 15 | 15 | 15 |
| 2 | 2 | 5 | 22 | 24 | 22 | 2 | 13 | 15 | 29 | 34 | 35 | 35 | 29 | 20 | 14 | 20 | 14 | 13 | 27 |
| 2 | 2 | 2 | 0 | 3 | 6 | 2 | 9 | 9 | 25 | 30 | 31 | 31 | 27 | 22 | 17 | 14 | 14 | 25 | 38 |
| 2 | 2 | 2 | 2 | 2 | 2 | 2 | 6 | 8 | 21 | 24 | 25 | 23 | 22 | 17 | 10 | 6 | 16 | 36 | 38 |
| 2 | 2 | 2 | 2 | 2 | 2 | 3 | 7 | 9 | 13 | 16 | 14 | 10 | 7 | 4 | 2 | 2 | 2 | 18 | 37 |
| 2 | 2 | 2 | 2 | 2 | 2 | 2 | 3 | 3 | 4 | 3 | 2 | 2 | 2 | 2 | 2 | 3 | 4 | 1 | 32 |
| 2 | 2 | 2 | 2 | 2 | 2 | 2 | 2 | 2 | 2 | 2 | 2 | 2 | 2 | 2 | 2 | 2 | 2 | 14 |   |
| 2 | 2 | 2 | 2 | 2 | 2 | 2 | 2 | 2 | 2 | 2 | 2 | 2 | 2 | 2 | 2 | 2 | 3 | 3 | 4 |
| 2 | 2 | 2 | 2 | 2 | 2 | 2 | 2 | 2 | 2 | 2 | 2 | 2 | 2 | 2 | 2 | 2 | 2 | 2 | 3 |

| | | | | | | | | | | | | | | | | | | | |
|---|---|---|---|---|---|---|---|---|---|---|---|---|---|---|---|---|---|---|---|
| 6 | 8 | 8 | 8 | 8 | 8 | 8 | 8 | 8 | 8 | 9 | 10 | 9 | 8 | 9 | 11 | 12 | 11 | 23 | 34 |
| -3 | -4 | -4 | -3 | -2 | -3 | -4 | -4 | -4 | -4 | -3 | -2 | -3 | -3 | -1 | 0 | 0 | 1 | 31 | 59 |
| 0 | 0 | 0 | 0 | 0 | 0 | 0 | 0 | 1 | 1 | -2 | -3 | -1 | 1 | 1 | -1 | -4 | 13 | 56 | 61 |
| 0 | 0 | 0 | 0 | 0 | 0 | 4 | 17 | 35 | 50 | 53 | 43 | 33 | 24 | 11 | 4 | 29 | 85 | 94 | 39 |
| 0 | 0 | 0 | 0 | 0 | 0 | 4 | 18 | 45 | 75 | 90 | 89 | 82 | 73 | 59 | 50 | 66 | 79 | 51 | 14 |
| 0 | 0 | -1 | -1 | 3 | 6 | 5 | 4 | 15 | 40 | 62 | 76 | 78 | 69 | 64 | 57 | 18 | -42 | -60 | -31 |
| 0 | 1 | 9 | 31 | 52 | 42 | 17 | 10 | 15 | 26 | 36 | 40 | 44 | 36 | 23 | 20 | -1 | -44 | -71 | -56 |
| 11 | 36 | 67 | 88 | 90 | 70 | 37 | 19 | 10 | -13 | -36 | -42 | -30 | -14 | -15 | -17 | 3 | 10 | -19 | -36 |
| 11 | 32 | 58 | 65 | 50 | 52 | 65 | 46 | 8 | -16 | -13 | -9 | -23 | -20 | -11 | -19 | -7 | 17 | 13 | -4 |
| 26 | 40 | 39 | 36 | 40 | 53 | 55 | 28 | 6 | 11 | 23 | 25 | 11 | -1 | -2 | -5 | -5 | 3 | 4 | -3 |
| 13 | 34 | 43 | 32 | 29 | 18 | -15 | -19 | -1 | -12 | -46 | -56 | -31 | -12 | -10 | -9 | -10 | -14 | -12 | -4 |
| -24 | -37 | -73 | -79 | -58 | -49 | -67 | -70 | -33 | -2 | 11 | 21 | 27 | 33 | 26 | 14 | 17 | 11 | -9 | 23 |
| 0 | -3 | -26 | -65 | -84 | -62 | -27 | -21 | -29 | -33 | -38 | -42 | -41 | -29 | -17 | -25 | -30 | 13 | 59 | 45 |
| 0 | 0 | 2 | 3 | -4 | -8 | -4 | -3 | -14 | -38 | -57 | -69 | -79 | -79 | -71 | -60 | -51 | -43 | -27 | -9 |
| 0 | 0 | 0 | 0 | 0 | 0 | -3 | -11 | -30 | -60 | -82 | -88 | -85 | -76 | -58 | -34 | -26 | -62 | -88 | -47 |
| 0 | 0 | 0 | 0 | 0 | -1 | -7 | -18 | -30 | -43 | -51 | -46 | -33 | -20 | -9 | -2 | 0 | -16 | -55 | -62 |
| 0 | 0 | 0 | 0 | 0 | 0 | -1 | -3 | -5 | -6 | -4 | -1 | 0 | 0 | 0 | 0 | -1 | 0 | -25 | -54 |
| 0 | 0 | 0 | 0 | 0 | 0 | 0 | 0 | 0 | 0 | 0 | 0 | 0 | 0 | 0 | 0 | 0 | -11 | -22 | 0 |
| -6 | -8 | -8 | -8 | -8 | -8 | -8 | -8 | -8 | -8 | -8 | -8 | -8 | -8 | -9 | -11 | -12 | -13 | -11 | 0 |

| 15 | 20 | 16 |
|---|---|---|
| 29 | 22 | 26 |
| 34 | 18 | 28 |

IMAGE DATA

| 1 | 0 | -1 |
|---|---|---|
| 2 | 0 | -2 |
| 1 | 0 | -1 |

FILTER

| 15×1=15 | 20×0=0 | 16×-1=-16 |
|---|---|---|
| 29×2=58 | 22×0=0 | 26×-2=-52 |
| 34×1=34 | 18×0=0 | 28×-1=-28 |

MULTIPLICATION OF PIXEL VALUE AND FILTER VALUE

|  |  |  |
|---|---|---|
|  | 15+0-16+58 +0-52+34+0 -28=11 |  |
|  |  |  |

ADDITION OF MULTIPLICATION RESULTS

|  |  |  |
|---|---|---|
|  | 11 |  |
|  |  |  |

STORE RESULTS

FIG. 24

| POSITION | p=1,q=1 | p=2,q=1 | p=3,q=1 | p=1,q=2 | p=3,q=2 | p=1,q=3 | p=2,q=3 | p=3,q=3 |
|---|---|---|---|---|---|---|---|---|
| SUB-IMAGE A | 1 | 0 | 0 | 2 | 0 | 1 | 0 | 0 |
| SUB-IMAGE B | 0 | 0 | 1 | 0 | 2 | 0 | 0 | 1 |
| SUB-IMAGE C | 0 | 0 | 0 | 0 | 0 | 0 | 1 | 0 |
| SUB-IMAGE D | 0 | 1 | 0 | 0 | 0 | 0 | 0 | 0 |

IMAGING SYSTEM AND IMAGING METHOD

BACKGROUND

1. Technical Field

The present disclosure relates to an imaging system and imaging method.

2. Description of the Related Art

So-called image processing, where computation processing is performed on numerical value data made up of a two-dimensionally arrayed numerical value group corresponding to image luminance or the like, is widely performed for enhancement or extraction of image features, removal of unnecessary noise, image recognition, and so forth.

A technique often used in this image processing is processing called "convolution". Convolution is computation using numerical value data of an original image, and a coefficient group called a filter that is prepared separately from the numerical value data of the original image.

On the other hand, Japanese Unexamined Patent Application Publication No. 2010-87850 discloses a technology where output distribution of an image sensor can be made to yield desired low-pass filter properties, by moving the position of an image sensor while exposing.

Japanese Examined Patent Application Publication No. 02-51316 discloses technology where a solid-state imaging device is relatively vibrated as to an incident optical image, thereby effectively widening the aperture area.

SUMMARY

One non-limiting and exemplary embodiment provides an imaging system whereby the computation amount of convolution processing can be reduced.

In one general aspect, the techniques disclosed here feature an imaging system including an imaging optical system that images an image of a subject, an imaging device including a plurality of pixel cells, an actuator that changes a relative position of the plurality of pixel cells and the image of the subject, and control circuitry that controls the imaging device and the actuator. The plurality of pixel cells each have variable sensitivity, and the plurality of pixel cells each include a photoelectric converter that converts light of the image of the subject into a signal charge, and a charge accumulation region that accumulates the signal charge obtained at the photoelectric converter. The control circuitry sets the relative position to a first position, and also sets the sensitivity of each of the plurality of pixel cells to a first sensitivity, to cause a first signal charge obtained at the photoelectric converter to be accumulated in the charge accumulation region in each of the plurality of pixel cells, and sets the relative position to a second position that is different from the first position, and also sets the sensitivity of each of the plurality of pixel cells to a second sensitivity that is different from the first sensitivity, to cause a second signal charge obtained at the photoelectric converter to be accumulated in the charge accumulation region in each of the plurality of pixel cells in addition to the first signal charge.

An imaging system according to an aspect of the present disclosure enables the computation amount of convolution processing to be reduced.

It should be noted that general or specific embodiments may be implemented as a device, an apparatus, a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3 is a diagram illustrating numerical value data of an original image;

FIG. 4 is a diagram illustrating numerical value data after convolution processing;

FIG. 6 is a diagram illustrating an example of convolution processing;

FIG. 24 is a diagram illustrating an example of the flow of imaging processing according to a fourth embodiment.

DETAILED DESCRIPTION

Figures 1, 2:
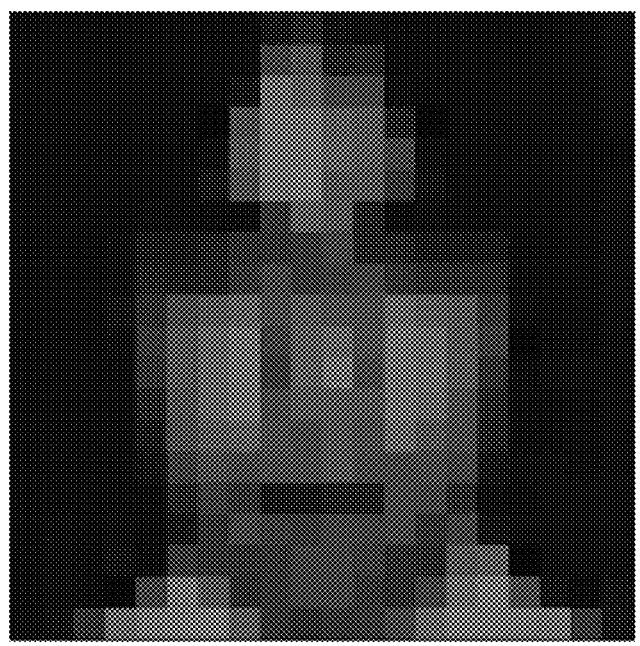
FIG. 1 is a diagram illustrating an example of a filter for convolution processing.
FIG. 2 is a diagram illustrating an example of an original image.

Underlying Knowledge Forming Basis of the Present Disclosure

In a case of performing convolution processing using software, the amount of computation increases in proportion to the increase in the number of pixels. Convolution processing is widely used in image recognition including so-called deep learning. Specifically, there are cases in processing such as deep learning and the like where convolution processing is performed on one image using more than 100 filters. In this case, increase in the number of pixels causes the amount of calculations to become massive. This problem is relatively small in a case where processing is performed taking time with a server that has high computation capabilities, but reduction in the amount of computations is strongly demanded for performing convolution with devices that have limited computation capabilities, such as mobile devices and so forth.

Accordingly, the present disclosure provides an imaging system and imaging method that enables the amount of computations for convolution processing to be reduced.

An imaging system according to an aspect of the present disclosure includes an imaging optical system that images an image of a subject, an imaging device including a plurality of pixel cells, an actuator that changes a relative position of the plurality of pixel cells and the image of the subject, and control circuitry that controls the imaging device and the actuator. The plurality of pixel cells each have variable sensitivity, and the plurality of pixel cells each include a photoelectric converter that converts light of the image of the subject into a signal charge, and a charge accumulation region that accumulates the signal charge obtained at the photoelectric converter. The control circuitry sets the relative position to a first position, and also sets the sensitivity of each of the plurality of pixel cells to a first sensitivity, to cause a first signal charge obtained at the photoelectric converter to be accumulated in the charge accumulation region in each of the plurality of pixel cells. The control circuitry further sets the relative position to a second position that is different from the first position, and also sets the sensitivity of each of the plurality of pixel cells to a second sensitivity that is different from the first sensitivity, to cause a second signal charge obtained at the photoelectric converter to be accumulated in the charge accumulation region in each of the plurality of pixel cells in addition to the first signal charge.

According to this configuration, the imaging system can obtain a piece of image data, in which signal charges obtained at different relative positions and different sensitivities have been accumulated, while changing the relative position between the plurality of pixel cells and the image of the subject, and changing the sensitivity of the plurality of pixel cells. Accordingly, at least part of convolution computation processing can be performed at the imaging device, so the amount of computation of convolution processing can be reduced.

The control circuitry may synchronously perform setting of the relative position to the first position, and setting of the sensitivity of each of the plurality of pixel cells to the first sensitivity. The control circuitry may also synchronously perform setting of the relative position to the second position, and setting of the sensitivity of each of the plurality of pixel cells to the second sensitivity.

The control circuitry may perform the setting to the second position by changing the relative position from the first position to the second position by an integer multiple of a center-to-center distance between two adjacent pixel cells out of the plurality of pixel cells. Accordingly, the imaging system can improve replicability of convolution computation.

An imaging system according to another aspect of the present disclosure includes an imaging optical system that images an image of a subject, an imaging device including a plurality of pixel cells, an actuator that changes a relative position of the plurality of pixel cells and the image of the subject, and control circuitry that controls the imaging device and the actuator. The plurality of pixel cells each have variable sensitivity, and the plurality of pixel cells each include a photoelectric converter that converts light of the image of the subject into a signal charge, and a charge accumulation region that accumulates the signal charge obtained at the photoelectric converter. During one exposure period, the control circuitry changes the relative position from a first position to a second position that is different from the first position, and changes the sensitivity of each of the plurality of pixel cells from a first sensitivity to a second sensitivity that is different from the first sensitivity, to cause a third signal charge obtained at the photoelectric converter to be accumulated at the charge accumulation region, in each of the plurality of pixel cells.

According to this configuration, the imaging system can obtain a piece of image data, in which signal charges obtained at different relative positions and different sensitivities have been accumulated, while changing the relative position between the plurality of pixel cells and the image of the subject, and changing the sensitivity of the plurality of pixel cells. Accordingly, at least part of convolution computation processing can be performed at the imaging device, so the amount of computation of convolution processing can be reduced.

The control circuitry may change the relative position from the first position to the second position in a continuous manner.

According to this configuration, the imaging system can easily realize changing of the relative position between the plurality of pixel cells and the image of the subject, and increase in shooting time due to this changing can be suppressed.

The control circuitry may change the sensitivity of each of the plurality of pixel cells from the first sensitivity to the second sensitivity in a continuous manner. Accordingly, the imaging system can improve replicability of convolution computation.

The control circuitry may perform the changing of the relative position and the changing of the sensitivity of each of the plurality of pixel cells in a synchronous manner.

The plurality of pixel cells may be laid out two-dimensionally in a row direction and a column direction.

The control circuitry may perform the setting or the changing of the sensitivity of each of the plurality of pixel cells all at once.

According to this configuration, the mechanism of the imaging system for changing sensitivity can be simplified.

Each of the plurality of pixel cells may include a first sub-pixel and a second sub-pixel. The first sub-pixel of each of the plurality of pixel cells may include the photoelectric converter and the charge accumulation region. The sensitivity of each of the plurality of pixel cells may be the sensitivity of the first sub-pixel. The second sub-pixel of each of the plurality of pixel cells may include a second photoelectric converter and a second charge accumulation region. The control circuitry may set or change sensitivity of the second sub-pixel independently from the sensitivity of the first sub-pixel in each of the plurality of pixel cells.

According to this configuration, the imaging system can generate a plurality of images obtained by different convolution computation at the same time.

The photoelectric converter may include a pixel electrode connected to the charge accumulation region, an opposing electrode that transmits light, and a photoelectric conversion layer disposed between the pixel electrode and the opposing electrode.

The imaging device may further include a voltage applying circuit that applies voltage across the pixel electrode and the opposing electrode included in the photoelectric converter, in each of the plurality of pixel cells. The control circuitry may change the sensitivity of each of the plurality of pixel cells by changing the voltage that the voltage applying circuit applies.

According to this configuration, the imaging system can change the sensitivity of the pixel cells by changing the voltage applied to the photoelectric converter.

An imaging method according to an aspect of the present disclosure is an imaging method in an imaging system. The imaging system includes an imaging optical system that images an image of a subject, an imaging device including a plurality of pixel cells, an actuator that changes a relative position of the plurality of pixel cells and the image of the subject, and control circuitry that controls the imaging device and the actuator. The plurality of pixel cells each have variable sensitivity, and the plurality of pixel cells each include a photoelectric converter that converts light of the image of the subject into a signal charge, and a charge accumulation region that accumulates the signal charge obtained at the photoelectric converter. The imaging method includes setting the relative position to a first position, setting the sensitivity of each of the plurality of pixel cells to a first sensitivity, causing a first signal charge obtained at the photoelectric converter to be accumulated in the charge accumulation region in each of the plurality of pixel cells in a state where the relative position is set to the first position and the sensitivity of each of the plurality of pixel cells set to the first sensitivity, setting the relative position to a second position that is different from the first position, setting the sensitivity of each of the plurality of pixel cells to a second sensitivity that is different from the first sensitivity, and causing a second signal charge obtained at the photoelectric converter to be accumulated in the charge accumulation region in each of the plurality of pixel cells in addition to the first signal charge, in a state where the relative position is set to the second position and the sensitivity of each of the plurality of pixel cells set to the second sensitivity.

According to this configuration, the imaging method can obtain a piece of image data, in which signal charges obtained at different relative positions and different sensitivities have been accumulated, while changing the relative position between the plurality of pixel cells and the image of the subject, and changing the sensitivity of the plurality of pixel cells. Accordingly, at least part of convolution computation processing can be performed at the imaging device, so the amount of computation of convolution processing can be reduced.

The setting to the second position may be performed by changing the relative position from the first position to the second position by an integer multiple of a center-to-center distance between two adjacent pixel cells out of the plurality of pixel cells. Accordingly, the imaging method can improve replicability of convolution processing.

The imaging system may further have a mechanical shutter that shields imaging device from light. The setting to the second position may be performed by changing the relative position from the first position to the second position in a state where the imaging device is shielded from light by the mechanical shutter.

According to this configuration, the imaging method can improve replicability of convolution computation, since exposure is not performed while changing the relative position.

The setting to the second position may be performed by changing the relative position from the first position to the second position in a state where the sensitivity of each of the plurality of pixel cells set to zero.

According to this configuration, the imaging method can improve replicability of convolution computation, since an arrangement can be made where exposure is not performed while changing the relative position.

The imaging method may further include: performing an N count (where N is an integer of 2 or greater) of settings of the relative position, including the setting to the first position and the setting to the second position, in which the relative position is set to an i'th (where i is an integer of 1 to N) position in an i'th setting of the relative position; performing an N count of settings of the sensitivity, including the setting to the first sensitivity and the setting to the second sensitivity, in which the sensitivity of each of the plurality of pixel cells is set to an i'th sensitivity in an i'th setting of the sensitivity; performing an N count of accumulations, including the accumulation of the first signal charge and the accumulation of the second signal charge, in which the i'th signal charge obtained at the photoelectric converter is accumulated at the charge accumulation region at each of the plurality of pixel cells in a state where the relative position is set to the i'th position and the sensitivity of each of the plurality of pixel cells is set to the i'th sensitivity at the i'th accumulation; and obtaining a piece of image data using one or more pieces of image data obtained by the N count of the accumulations. The piece of image data may be equivalent to a piece of image data obtainable by predetermined first convolution processing. The i'th position may correspond to a position of an i'th coefficient included in an N count of coefficients out of a plurality of coefficients in the first convolution processing. The i'th sensitivity may correspond to the value of the i'th coefficient.

According to this configuration, at least part of convolution computation processing can be performed at the imaging device, so the amount of computation of convolution processing can be reduced.

The one or more pieces of image data may include a first piece of image data and a second piece of image data. The N may be an integer of 3 or greater. The N count of coefficients may be made up of an M (wherein M is an integer of 1 or greater but smaller than N) count of coefficients having a positive value, and an (N−M) count of coefficients having a negative value. The first piece of image data may correspond to a sum value of signal charges accumulated in the charge accumulation region of each of the plurality of pixel cells, by the M count of accumulations corresponding to the M count of coefficients. The second piece of image data may correspond to a sum value of signal charges accumulated in the charge accumulation region of each of the plurality of pixel cells, by an (N−M) count of accumulations corresponding to the (N−M) count of negative coefficients. The piece of image data equivalent to the piece of image data obtained by the first convolution processing may be obtained by subtracting the second piece of image data from the first piece of image data.

According to this configuration, convolution computation processing including negative coefficients can be realized by this imaging method.

The imaging method may further include: performing an N count (where N is an integer of 4 or greater) of settings of the relative position, including the setting to the first position and the setting to the second position, in which the relative position is set to an i'th (where i is an integer of 1 to N) position in an i'th setting of the relative position; performing an N count of settings of the sensitivity, including the setting to the first sensitivity and the setting to the second sensitivity, in which the sensitivity of each of the plurality of pixel cells is set to an i'th sensitivity in an i'th setting of the sensitivity; performing an N count of accumulations, including the accumulation of the first signal charge and the accumulation of the second signal charge, in which the i'th signal charge obtained at the photoelectric converter is accumulated at the charge accumulation region at each of the plurality of pixel cells in a state where the relative position is set to the i'th position and the sensitivity of each of the plurality of pixel cells is set to the i'th sensitivity at the i'th accumulation; performing a setting to a sensitivity corresponding to a sum value of an offset value and one of a plurality of coefficients of predetermined first convolution processing, in each of an M (wherein M is an integer of 2 or greater but smaller than N) counts of settings, out of the N counts of settings of the sensitivity; performing a setting to sensitivity corresponding to the offset value in each of the (N−M) count of settings, out of the N counts of settings of the sensitivity; obtaining a first piece of image data by an M count of accumulations corresponding to the M count of settings of the sensitivity, the first piece of image data being equivalent to a piece of image data obtainable by convolution processing using a plurality of coefficients obtainable by adding an offset value to all coefficients of the first convolution processing; obtaining a second piece of image data by an (N−M) count of accumulations corresponding to the (N−M) count of settings of the sensitivity, the second piece of image data being equivalent a piece of image data obtainable by convolution processing using the offset value as all coefficients; and obtaining a piece of image data by subtracting the second piece of image data from the first piece of image data. The piece of image data may be equivalent to a piece of image data obtainable by the first convolution processing.

According to this configuration, convolution computation processing including negative coefficients can be realized by this imaging method. In a case where a plurality of images subjected to different convolution processing from each other are obtained, the second piece of image data can be used in common, so shooting time can be reduced.

The value of the N count of coefficients used for the N count of settings of the sensitivity may not be 0. Accordingly, the shooting time for the imaging method can be reduced.

The imaging method may further include: obtaining a piece of image data equivalent to a piece of image data obtainable by second convolution processing that is different from the first convolution processing. Each of the plurality of pixel cells may include a first sub-pixel and a second sub-pixel. The first sub-pixel of each of the plurality of pixel cells may include the photoelectric converter and the charge accumulation region. The sensitivity of each of the plurality of pixel cells may be sensitivity of the first sub-pixel. The second sub-pixel of each of the plurality of pixel cells may include a second photoelectric converter and a second charge accumulation region. In each of the N count of settings of the sensitivity, sensitivity of the second sub-pixel in each of the plurality of pixel cells may be further set. In at least one of the N count of settings of the sensitivity, a setting value of the sensitivity of the first sub-pixel may be different from a setting value of the sensitivity of the second sub-pixel. In each of the N count of accumulations, a signal charge obtained at the second photoelectric converter of the second sub-pixel may be accumulated in the second charge accumulation region, in each of the plurality of pixel cells. The piece of image data equivalent to the piece of image data obtainable by the first convolution processing may be obtained using one or more pieces of image data obtained by the plurality of first sub-pixels by the N count of accumulations. The piece of image data equivalent to the piece of image data obtainable by the second convolution processing may be obtained using one or more other images obtained by the plurality of second sub-pixels by the N count of accumulations.

Accordingly, a plurality of images obtained by different convolution computation can be obtained by this imaging method.

The imaging method may further include: performing an N count (where N is an integer of 2 or greater) of settings of the relative position, including the setting to the first position and the setting to the second position, in which the relative position is set to an i'th (where i is an integer of 1 to N) position in an i'th setting of the relative position; performing an N count of settings of the sensitivity, including the setting to the first sensitivity and the setting to the second sensitivity, in which the sensitivity of each of the plurality of pixel cells is set to an i'th sensitivity in an i'th setting of the sensitivity, and the exposure time is set to an i'th exposure time; performing an N count of accumulations, including the accumulation of the first signal charge and the accumulation of the second signal charge, in which the i'th signal charge obtained at the photoelectric converter in the i'th exposure time is accumulated at the charge accumulation region at each of the plurality of pixel cells in a state where the relative position is set to the i'th position and the sensitivity of each of the plurality of pixel cells is set to the i'th sensitivity at the i'th accumulation; and obtaining a piece of image data using one or more pieces of image data obtained by the N count of the accumulations, the piece of image data being equivalent to a piece of image data obtainable by predetermined first convolution processing.

According to this configuration, a broader range of coefficients can be handled by combining sensitivity and exposure time.

An imaging method according to another aspect of the present disclosure is an imaging method in an imaging system. The imaging system includes an imaging optical system that images an image of a subject, an imaging device including a plurality of pixel cells, an actuator that changes a relative position of the plurality of pixel cells and the image of the subject, and control circuitry that controls the imaging device and the actuator. The plurality of pixel cells each have variable sensitivity. The plurality of pixel cells each include a photoelectric converter that converts light of the image of the subject into a signal charge, and a charge accumulation region that accumulates the signal charge obtained at the photoelectric converter. The imaging method includes: performing, during one exposure period, changing the relative position from a first position to a second position that is different from the first position; changing the sensitivity of each of the plurality of pixel cells from a first sensitivity to a second sensitivity that is different from the first sensitivity; and causing a third signal charge obtained at the photoelectric converter to be accumulated at the charge accumulation region, in each of the plurality of pixel cells.

According to this configuration, the imaging method can obtain a piece of image data where signal charges obtained at different relative positions and different sensitivities have been accumulated, while changing the relative position between the plurality of pixel cells and the image of the subject, and changing the sensitivity of the plurality of pixel cells. Accordingly, at least part of convolution computation processing can be performed at the imaging device, so the amount of computation of convolution processing can be reduced.

The relative position may be changed from the first position to the second position in a continuous manner. According to this configuration, the imaging method can easily realize changing of the relative position between the plurality of pixel cells and the image of the subject, and increase in shooting time due to this changing can be suppressed.

The sensitivity of each of the plurality of pixel cells may be changed from the first sensitivity to the second sensitivity in a continuous manner. Accordingly, the imaging method can improve replicability of convolution computation.

The following is a description of the imaging system and imaging method according to the present disclosure, with reference to the drawings. Note that the embodiments described below are all general or specific examples. Accordingly, values, shapes, materials, components, layout and connection state of components, steps, the order of steps, and so forth illustrated in the following embodiments, are only exemplary, and are not intended to restrict the present disclosure. Various aspects described in the present embodiment may be combined with each other to the extent that there is no conflict. Components in the following embodiments which are not included in the independent Claim indicating the most general concept are described as optional components. Components having substantially the same functions may be denoted by common reference numerals, and description thereof may be omitted.

First Embodiment

First, convolution processing will be explained. A filter used in convolution processing has a coefficient group laid out two-dimensionally as x×y, as a plurality of elements. The x and y here are each integers that are 2 or greater. A reference position in the two-dimensional layout will be referred to as the center of the filter. In a case of a filter where the number of rows and the number of columns are both odd, the middle of the layout is often used as the center of the filter. FIG. 1 illustrates an example of a filter including 3×3 coefficients.

Figure 5:
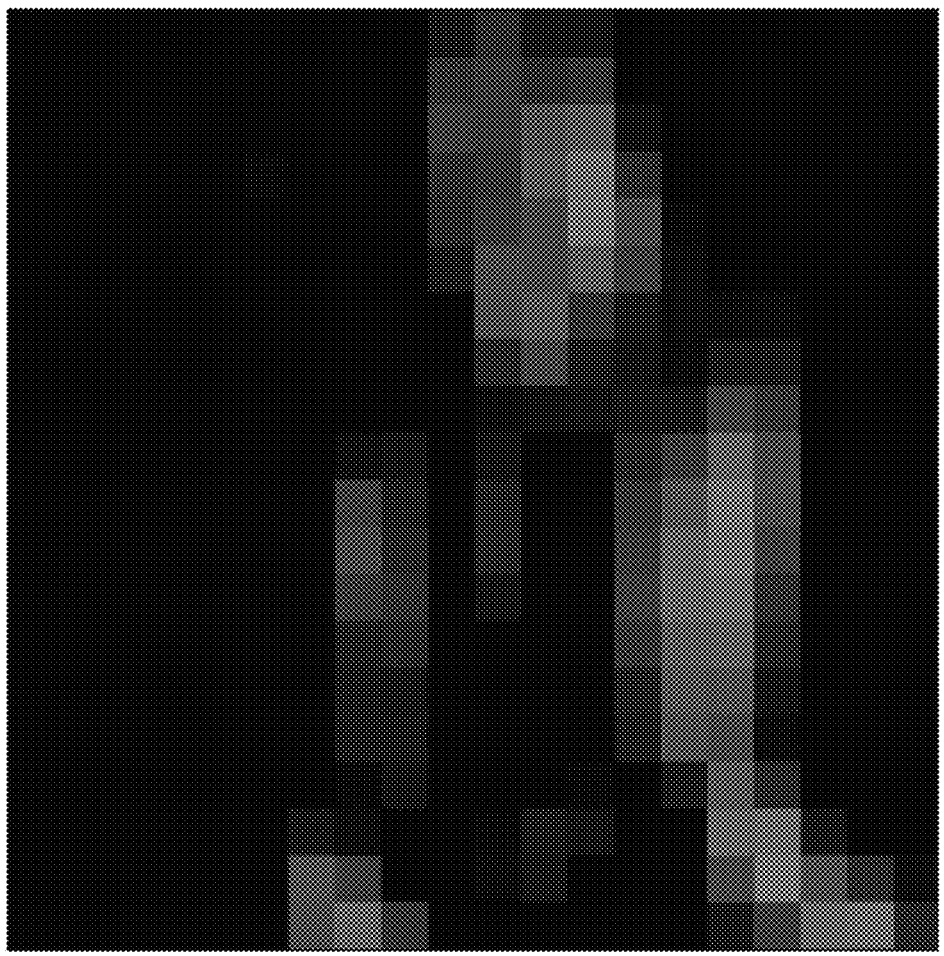
FIG. 5 is a diagram illustrating an image corresponding to numerical value data after convolution processing.

FIG. 2 illustrates an example of an original image. FIG. 3 illustrates numerical value data where luminance and so forth of the original image in FIG. 2 has been quantified. FIG. 4 illustrates numerical value data after convolution processing has been performed using the filter illustrated in FIG. 1. FIG. 5 illustrates an image corresponding to the numerical value data in FIG. 4.

Note that in numerical value data corresponding to an image with a pixel count of N, the filter will run over the edge of the image for convolution at pixels situated at the edge portions of the display (e.g., pixels in the far left column, etc.). In this case, convolution is performed virtually assuming that pixels of numerical value 0 exist at the portions running over the edge. In the image following convolution processing in FIG. 5, pixels where the numerical value is negative are represented as being black.

Convolution is performed according to the following flow. FIG. 6 illustrates the flow of convolution processing with regard to one selected pixel.

First, a pixel of interest to which the filter is to be applied is selected from yet-to-be selected pixels in the numerical value data of the original image laid out two-dimensionally. Next, the center of the filter is placed over the position of the pixel of interest. The products of numerical value data and filter coefficient values are then calculated for each overlaid position. The sum of all calculated products is calculated next.

The calculated sum is then stored as the numerical value of the pixel of interest after the convolution processing. Determination is made regarding whether or not all pixels have been processed. If processing of all pixels is complete, the processing ends, and if not completed, the next pixel is selected as the pixel of interest, and the above-described series of processing is performed on that pixel of interest.

In a case of performing convolution processing using a filter having an element count of M on numerical value data of an image having a pixel count of N, basically N×M multiplications and M additions need to be computed. There is a problem that the amount of computations is great in a case where all of the convolution processing is to be realized by software.

Figure 7:
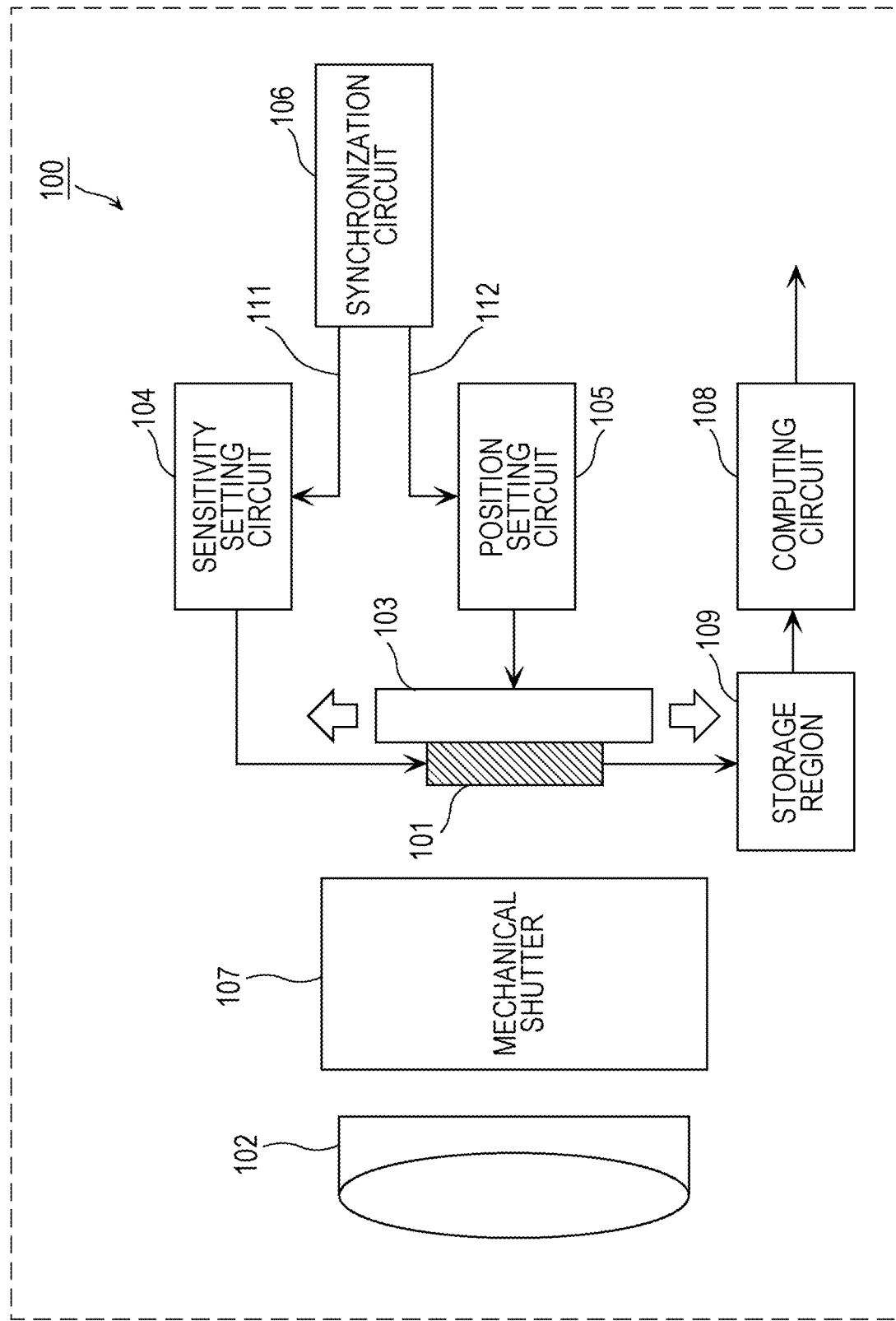
FIG. 7 is a conceptual configuration diagram illustrating an example of an imaging system according to a first embodiment.

The configuration of an imaging system 100 according to the present embodiment will be described below. FIG. 7 is a conceptual diagram illustrating the configuration of the imaging system 100 according to the present embodiment. FIG. 7 only illustrates elements necessary for description of the present disclosure, and other elements are omitted. Further, the actual shapes, scale, and so forth of the elements are not given consideration.

As illustrated in FIG. 7, the imaging system 100 is provided with an imaging device 101 whose sensitivity can be electrically changed, an imaging optical system 102, a position setting unit 103, a sensitivity setting circuit 104, a position setting circuit 105, a synchronization circuit 106, a mechanical shutter 107, a computing circuit 108, and a storage region 109.

The imaging optical system 102 images an image of a subject on the imaging device 101. The imaging device 101 includes a plurality of pixel cells 10 laid out two-dimensional in the row direction and column direction, as illustrated in FIG. 8.

The sensitivity setting circuit 104 sets the sensitivity of each of the plurality of pixel cells 10 based on a control signal 111 (also referred to as "second control signal"). The position setting circuit 105 sets the relative positions of the plurality of pixel cells 10 and the subject image, based on a control signal 112 (also referred to as "first control signal"). The synchronization circuit 106 synchronizes the control signal 111 and control signal 112. For example, the synchronization circuit 106 generates control signals 111 and control signals 112 that are synchronized with each other.

Figure 8:
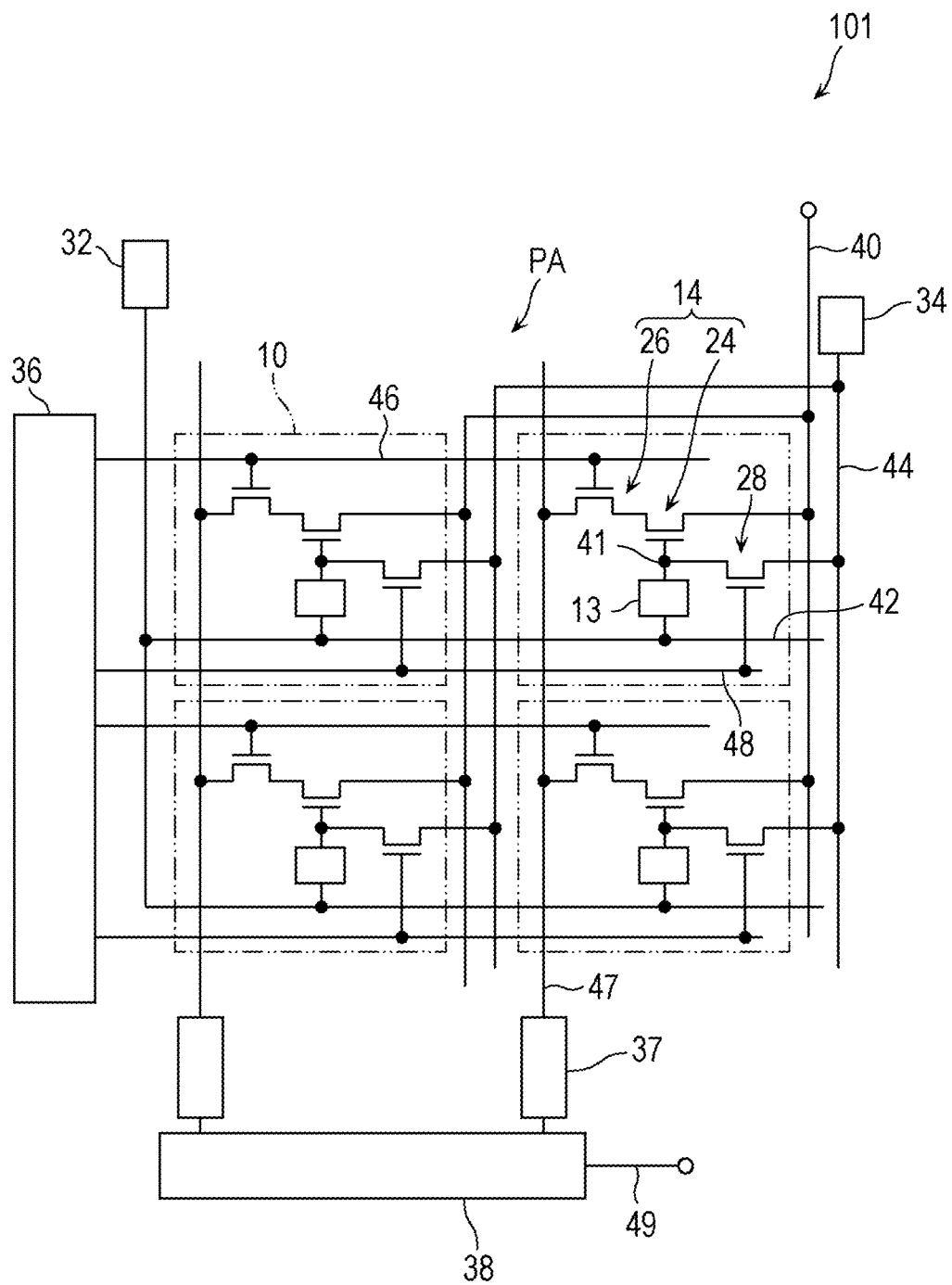
FIG. 8 is a schematic diagram illustrating an exemplary circuit configuration of an imaging device according to the first embodiment.

FIG. 8 illustrates an exemplary circuit configuration of the imaging device 101 according to the present disclosure. The imaging device 101 illustrated in FIG. 8 has a pixel array PA including the plurality of pixel cells 10 arrayed two-dimensionally. FIG. 8 schematically illustrates an example where pixel cells 10 are laid out in a two-row two-column matrix.

It is needless to say that the number and layout of pixel cells 10 in the imaging device 101 is not restricted to the example illustrated in FIG. 8.

The pixel cell 10 includes a photoelectric converter 13 and a signal detection circuit 14. The photoelectric converter 13 has two opposing electrodes, and a photoelectric conversion layer interposed between these two electrodes, and generates signal charges upon receiving incident light, which will be described later with reference to the drawings. One entire photoelectric converter 13 does not have to be an independent element for each pixel cell 10, and part of a photoelectric converter 13 may extend over multiple pixel cells 10, for example. In other words, part of one photoelectric converter 13 may be integrally formed with part of another photoelectric converter 13. In the case of the present embodiment, the incident-side electrode and photoelectric conversion layer extend over part or all of the pixel cell 10.

The signal detection circuit 14 is a circuit that detects signals generated by the photoelectric converter 13. In this example, the signal detection circuit 14 has a signal detecting transistor 24 and an address transistor 26. The signal detecting transistor 24 and address transistor 26 typically are field effect transistors (FET), the signal detecting transistor 24 and address transistor 26 being exemplified here as being N-channel metal-oxide semiconductor (MOS) devices.

The control terminal (gate in this case) of the signal detecting transistor 24 has an electrical connection with the photoelectric converter 13, as schematically illustrated in FIG. 8. Signal charges (holes or electrons) generated at the photoelectric converter 13 are accumulated at a charge accumulation region (also referred to as "floating diffusion node") 41 between the gate of the signal detecting transistor 24 and the photoelectric converter 13. The structure of the photoelectric converter 13 will be described in detail later.

The photoelectric converter 13 of each pixel cell 10 further has connection with a sensitivity control line 42 in the configuration illustrated in FIG. 8. The sensitivity control line 42 is connected to a voltage supply circuit 32. This voltage supply circuit 32 is a circuit configured to be capable of supplying at least three types of voltage, which are a first voltage, second voltage, and third voltage, to the photoelectric converter 13. The voltage supply circuit 32 supplies predetermined voltage to the photoelectric converter 13 via the sensitivity control line 42 when the imaging device 101 is operating. The voltage supply circuit 32 is not restricted to a particular power source circuit, and may be a circuit that generates a predetermined voltage, or may be a circuit that converts voltage supplied from another power source into a predetermined voltage. Starting and ending accumulation of signal charges from the photoelectric converter 13 to the charge accumulation region 41 is controlled by switching of the voltage supplied from the voltage supply circuit 32 to the photoelectric converter 13. The voltage is switched between a plurality of voltages that are different from each other, which will be described in detail later. In other words, electronic shutter operations are executed in the embodiments of the present disclosure by switching of the voltage supplied from the voltage supply circuit 32 to the photoelectric converter 13. The sensitivity of the photoelectric converter 13 can also be switched, by switch of the voltage supplied from the voltage supply circuit 32 to the photoelectric converter 13. The voltage supply circuit 32 is an example of a voltage applying circuit. An example of operations of the imaging device 101 will be described later.

The pixel cells 10 each have a connection with a power source line 40 that supplies power source voltage VDD. An input terminal (typically drain) of the signal detecting transistor 24 is connected to the power source line 40, as illustrated in FIG. 8. The signal detecting transistor 24 outputs voltage corresponding to the signal charge generated by the photoelectric converter 13 as signal voltage, by the power source line 40 functioning as a source follower power source.

The input terminal (e.g., the drain) of the address transistor 26 is connected to the output terminal (e.g., the source) of the signal detecting transistor 24. The output terminal (e.g., the source) of the address transistor 26 is connected to one of a plurality of vertical signal lines 47 arrayed for each column of the pixel array PA. The control terminal (e.g., the gate) of the address transistor 26 is connected to an address control line 46, and controlling the potential of the address control line 46 enables the output of the signal detecting transistor 24 to be selectively read out to a corresponding vertical signal line 47.

In the example illustrated in FIG. 8, the address control line 46 is connected to a vertical scanning circuit (also referred to as "row scanning circuit") 36. The vertical scanning circuit 36 selects one or more rows of pixel cells 10 by applying predetermined voltage to the corresponding address control lines 46. Accordingly, readout of signals of the selected pixel cells 10 is performed.

The vertical signal line 47 is a main signal line that transmits pixel signals from the pixel array PA to peripheral circuits. A column signal processing circuit (also referred to as "row signal accumulating circuit") 37 is connected to the vertical signal line 47. The column signal processing circuit 37 performs noise suppressing signal processing (such as correlated double sampling), analog-to-digital conversion (AD conversion), and so forth. A column signal processing circuit 37 is provided corresponding to each column of the pixel cells 10 in the pixel array PA, as illustrated in FIG. 8. A horizontal signal readout circuit (also referred to as "column scanning circuit") 38 is connected to these column signal processing circuits 37. The horizontal signal readout circuit 38 sequentially reads signals from the column signal processing circuits 37 and output signals to a horizontal common signal line 49.

In the configuration exemplified in FIG. 8, the pixel cells 10 each have a reset transistor 28. The reset transistor 28 is a field effect transistor in the same way as the signal detecting transistor 24 and address transistor 26, for example. In the following description, an example where an N-channel MOS device has been applied to the reset transistor will be described, unless particularly stated otherwise. The reset transistor 28 is connected between a reset voltage line 44 that supplies a reset voltage Vr, and the charge accumulation region 41, as illustrated in FIG. 8. The control terminal of the reset transistor 28 (e.g., the gate) is connected to a reset control line 48, and the potential of the charge accumulation region 41 can be reset to the reset voltage Vr by controlling the potential of the reset control line 48. In this example, the reset control line 48 is connected to the vertical scanning circuit 36. Accordingly, one or more row of the plurality of pixel cells 10 can be reset by the vertical scanning circuit 36 applying a predetermined voltage to the corresponding reset control lines 48.

In this example, the reset voltage line 44 that supplies the reset voltage Vr to the reset transistors 28 is connected to a reset voltage supply circuit 34 (hereinafter referred to as "reset voltage source 34"). It is sufficient for the reset voltage source 34 to have a configuration capable of supplying the predetermined reset voltage Vr to the reset voltage line 44 when the imaging device 101 is operating, and is not restricted to a particular power supply circuit, in the same way as with the voltage supply circuit 32 described above. The voltage supply circuit 32 and reset voltage source 34 may each be part of a single voltage supply circuit, or may be individually independent voltage supply circuits. Note that one or both of the voltage supply circuit 32 and reset voltage source 34 may be part of the vertical scanning circuit 36. Alternatively, sensitivity control voltage from the voltage supply circuit 32 and/or reset voltage Vr from the reset voltage source 34 may be supplied to the pixel cells 10 via the vertical scanning circuit 36.

The power source voltage VDD of the signal detection circuit 14 may be used as the reset voltage Vr. In this case, a voltage supply circuit (omitted from illustration in FIG. 8) that supplies power source voltage to each pixel cell 10 and the reset voltage source 34 may be commonalized. Further, the power source line 40 and reset voltage line 44 can be commonalized, so the wiring of the pixel array PA can be simplified. Note however, that using different voltages from each other for the reset voltage Vr and the power source voltage VDD of the signal detection circuit 14 enables more flexible control of the imaging device 101.

Figure 9:
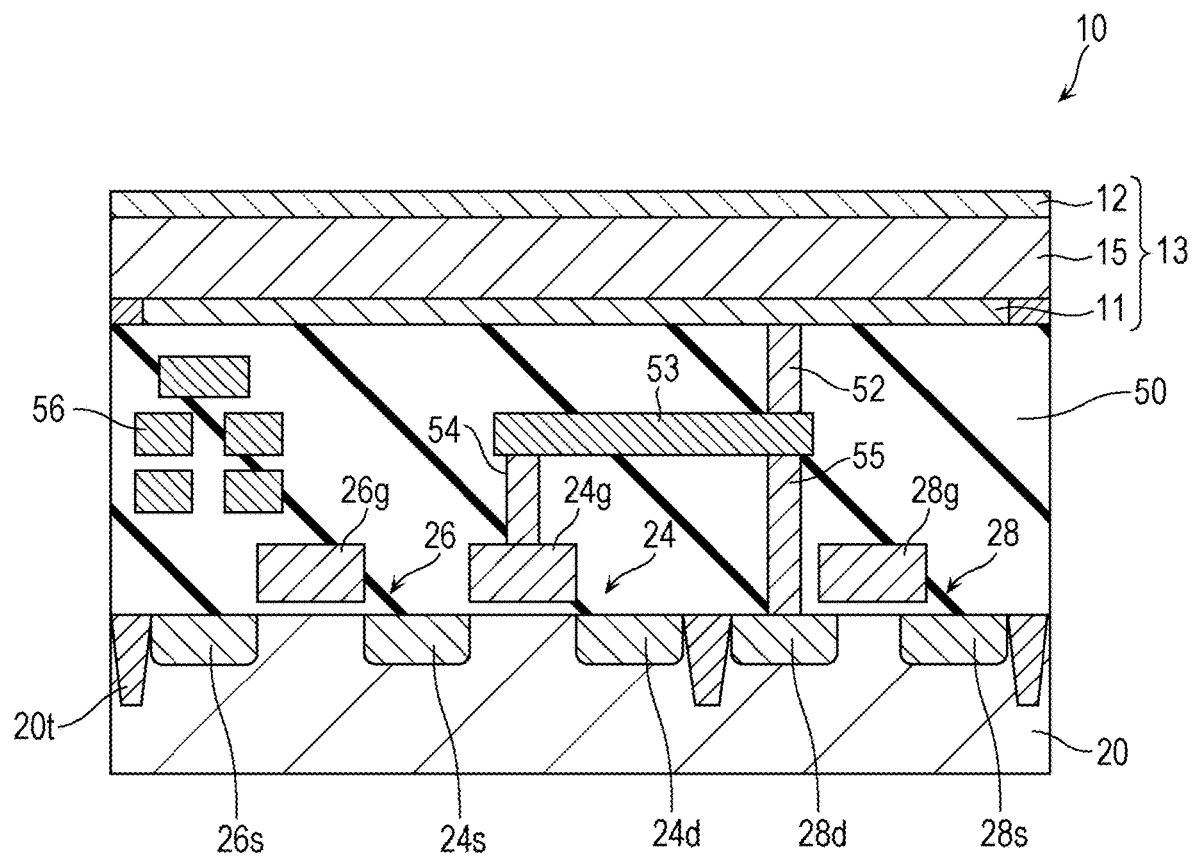
FIG. 9 is a configuration diagram illustrating an example of a layered imaging device with variable sensitivity, according to the first embodiment.

FIG. 9 schematically illustrates an exemplary device structure of the pixel cell 10. In the configuration exemplified in FIG. 9, the above-described signal detecting transistor 24, address transistor 26, and reset transistor 28 are formed on a semiconductor substrate 20. The semiconductor substrate 20 is not restricted to a substrate that is entirely of a semiconductor. The semiconductor substrate 20 may be an insulating substrate where a semiconductor layer is provided on a side where a photosensitive region is formed. Description will be made here regarding an example of using a P-type silicon (Si) substrate as the semiconductor substrate 20.

The semiconductor substrate 20 has impurity regions (N-type regions here) 26s, 24s, 24d, 28d, and 28s, and element isolation regions 20t for electrical isolation among the pixel cells 10. The element isolation regions 20t are also formed between impurity region 24d and impurity region 28d as well. The element isolation regions 20t are formed by acceptor ion injection under predetermined injection conditions, for example.

The impurity regions 26s, 24s, 24d, 28d, and 28s typically are diffusion layers formed in the semiconductor substrate 20. The signal detecting transistor 24 includes impurity regions 24s and 24d, and a gate electrode 24g (typically a polysilicon electrode), as schematically illustrated in FIG. 9. The impurity regions 24s and 24d respectively serve as the source region and drain region of the signal detecting transistor 24, for example. The channel region of the signal detecting transistor 24 is formed between the impurity regions 24s and 24d.

In the same way, the address transistor 26 includes impurity regions 26s and 24s, and a gate electrode 26g (typically a polysilicon electrode) connected to the address control line 46 (see FIG. 8). The signal detecting transistor 24 and address transistor 26 are electrically connected to each other in this example, by sharing the impurity region 24s. The impurity region 26s functions as a source region, for example, of the address transistor 26. The impurity region 26s has a connection with the vertical signal line 47 (see FIG. 8) that is omitted from illustration in FIG. 9.

The reset transistor 28 includes impurity regions 28d and 28s, and a gate electrode 28g (typically a polysilicon electrode) connected to the reset control line 48 (see FIG. 8). The impurity region 28s functions as a source region, for example, of the reset transistor 28. The impurity region 28s has a connection with the reset voltage line 44 (see FIG. 8) that is omitted from illustration in FIG. 9.

An inter-layer insulating layer 50 (typically a silicon dioxide layer) is disposed on the semiconductor substrate 20, so as to cover the signal detecting transistor 24, address transistor 26, and reset transistor 28. A wiring layer 56 may be disposed within the inter-layer insulating layer 50, as illustrated in FIG. 9. The wiring layer 56 is typically formed of metal such as copper or the like, and may partially include wiring such as the above-described vertical signal line 47, for example. The number of insulating layers in the inter-layer insulating layer 50, and the number of layers included in the wiring layer 56 disposed in the inter-layer insulating layer 50, can be optionally set, and are not restricted to the example illustrated in FIG. 9.

The above-described photoelectric converter 13 is disposed on the inter-layer insulating layer 50. In other words, the plurality of pixel cells 10 making up the pixel array PA (see FIG. 8) are formed on the semiconductor substrate 20 in the embodiments of the present disclosure. The plurality of pixel cells 10 arrayed two-dimensionally on the semiconductor substrate 20 make up a photosensitive region (i.e., a pixel region). The distance between the centers of two adjacent pixel cells 10 (i.e., pixel pitch) is around 2 μm, for example.

The photoelectric converter 13 includes a pixel electrode 11, an opposing electrode 12, and a photoelectric conversion layer 15 disposed therebetween. In this example, the opposing electrode 12 and photoelectric conversion layer 15 are disposed extending over the plurality of pixel cells 10. On the other hand, the pixel electrode 11 is provided for each pixel cell 10, and is spatially separated from the pixel electrodes 11 of the adjacent other pixel cells 10, thereby being electrically isolated from the pixel electrodes 11 of the other pixel cells 10.

The opposing electrode 12 typically is a transparent electrode formed of a transparent electroconductive material. The opposing electrode 12 is disposed on the side of the photoelectric conversion layer 15, the side receiving incident light. Accordingly, light that has been transmitted through the opposing electrode 12 enters the photoelectric conversion layer 15. Note that the light detected by the imaging device 101 is not restricted to light within the wavelength range of visible light (e.g., 380 nm to 780 nm). The term "transparent" in the present specification means to transmit at least part of a wavelength range that is to be detected. Electromagnetic waves as a whole, including infrared rays and ultraviolet rays, are expressed as "light" in the present specification, for the sake of convenience. Transparent conducting oxides (TCO) such as indium tin oxide (ITO), indium zinc oxide (IZO), aluminum-doped zinc oxide (AZO), fluoride-doped tin oxide (FTO), stannic oxide ($SnO_2$), titanium dioxide ($TiO_2$), zinc peroxide ($ZnO_2$), and so forth, can be used for the opposing electrode 12, for example.

The photoelectric conversion layer 15 receives incident light and generates a hole-electron pair. In the present embodiment, the photoelectric conversion layer 15 is formed of an organic material. Specific examples of materials making up the photoelectric conversion layer 15 will be described later.

The opposing electrode 12 has a connection with the sensitivity control line 42 that is connected to the voltage supply circuit 32, as described earlier with reference to FIG. 8. The opposing electrode 12 here is formed across the plurality of pixel cells 10. Accordingly, sensitivity control voltage of a predetermined magnitude can be applied to the plurality of pixel cells 10 at once from the voltage supply circuit 32 via the sensitivity control line 42. Note that the opposing electrodes 12 may be provided separated for each pixel cell 10, as long as the sensitivity control voltage of a predetermined magnitude can be applied from the voltage supply circuit 32. In the same way, the photoelectric conversion layer 15 may be provided separated for each pixel cell 10.

Controlling the potential of the opposing electrode 12 as to the pixel electrode 11 enables one of the hole and electron of the hole-electron pair generated in the photoelectric conversion layer 15 by photoelectric conversion to be collected by the pixel electrode 11. For example, in a case of using holes as signal charges, holes can be selectively collected at the pixel electrode 11 by setting the potential of the opposing electrode 12 to be higher than the pixel electrode 11. A case of using holes as signal charges will be exemplified below. Of course, electrons can be used as signal charges.

The pixel electrode 11 facing the opposing electrode 12 collects one of positive and negative charges generated by photoelectric conversion at the photoelectric conversion layer 15, by an appropriate bias voltage being provided across the opposing electrode 12 and pixel electrode 11. The pixel electrode 11 is formed of metal such as aluminum, copper, or so forth, metal nitride, polysilicon that has been imparted electroconductivity by being doped with an impurity or the like.

The pixel electrode 11 may be a light-shielding electrode. For example, sufficient light-shielding properties can be realized by forming a tantalum nitride (TaN) electrode having a thickness of 101 nm, as the pixel electrode 11. Forming the pixel electrode 11 as a light-shielding electrode enables incident light that has passed through the photoelectric conversion layer 15 to be suppressed from entering the channel region or impurity region of transistors (in this example, at least one of the signal detecting transistor 24, address transistor 26, and reset transistor 28) formed on the semiconductor substrate 20. A light-shielding film may also be formed within the inter-layer insulating layer 50 using the above-described wiring layer 56. Suppressing incident light to the channel region of transistors formed on the semiconductor substrate 20 enables shifting of transistor properties (e.g., change in threshold voltage) and so forth to be suppressed. Suppressing incident light to the impurity region formed on the semiconductor substrate 20 enables noise due to unintended photoelectric conversion from occurring at the impurity region. This, suppression of incident light to the semiconductor substrate 20 contributes in improved reliability of the imaging device 101.

The pixel electrode 11 is connected to the gate electrode 24g of the signal detecting transistor 24 via a plug 52, wiring 53, and a contact plug 54, as schematically illustrated in FIG. 9. In other words, the gate of the signal detecting transistor 24 has electrical connection with the pixel electrode 11. The plug 52 and wiring 53 are formed of metal such as copper or the like, for example. The plug 52, wiring 53, and contact plug 54 make up at least part of the charge accumulation region 41 (see FIG. 8) between the signal detecting transistor 24 and the photoelectric converter 13. The wiring 53 may be part of the wiring layer 56. The pixel electrode 11 is also connected to the impurity region 28d via the plug 52, wiring 53, and a contact plug 55. In the configuration exemplified in FIG. 9, the gate electrode 24g of the signal detecting transistor 24, the plug 52, wiring 53, contact plugs 54 and 55, and the impurity region 28d that is one of the source region and drain region of the reset transistor 28, function as the charge accumulation region 41 that accumulates signal charges collected by the pixel electrode 11.

Due to signal charges collected by the pixel electrode 11, voltage corresponding to the amount of signal charges accumulated at the charge accumulation region 41 is applied to the gate of the signal detecting transistor 24. The signal detecting transistor 24 amplifies this voltage. The voltage amplified by the signal detecting transistor 24 is selectively read out via the address transistor 26, as signal voltage.

As described above, the imaging device 101 has the plurality of pixel cells 10 two-dimensionally laid out equidistantly in the row direction and column direction. Note that the pitch of the pixels in the row direction and the pitch of the pixels in the column direction do not have to be the same.

The pixel cell 10 has at least one set of photoelectric converter 13 and charge accumulation region 41. The photoelectric converter 13 functions to generate signal charges of an amount proportionate to the intensity of light shining on that region. The charge accumulation region 41 functions to accumulate the signal charges generated by the corresponding photoelectric converter 13.

Note that each pixel cell 10 may have a plurality of sets of the photoelectric converter 13 and charge accumulation region 41. For example, in order to perform color imaging, each pixel may have sets of the photoelectric converter 13 and charge accumulation region 41 to image each of red component, green component, and blue component. As a separate example, each pixel may have a set of the photoelectric converter 13 and charge accumulation region 41 for high-sensitivity imaging, and a set of the photoelectric converter 13 and charge accumulation region 41 for low-sensitivity imaging. In this case, imaging processing described later may be performed by the set of the photoelectric converter 13 and charge accumulation region 41 for high-sensitivity imaging. Imaging processing described later may be performed by the set of the photoelectric converter 13 and charge accumulation region 41 for low-sensitivity imaging. The charge accumulation region 41 usually is integrated within the imaging device 101, but may be externally disposed.

At least one charge accumulation region 41 exists for each photoelectric converter 13. However, a configuration may be made where a plurality of charge accumulation regions 41 exist for one photoelectric converter 13, and the destination of accumulating signal charges can be changed. In this case, image processing described later may be performed using any one of the plurality of charge accumulation regions 41.

The ratio of the amount of signal charges generated as to the light intensity by which the photoelectric converter 13 is irradiated is called quantum efficiency. The ratio of the amount of signal charges accumulated in the charge accumulation region 41 as to the light intensity by which the photoelectric converter 13 is irradiated is called sensitivity. In a case where all signal charges generated at the photoelectric converter 13 are accumulated in the charge accumulation region 41, the quantum efficiency and sensitivity are in a proportionate relation. However, the two may be in a relation other than proportionate, in a case of a mechanism where part or all of signal charges generated at the photoelectric converter 13 are not accumulated at the charge accumulation region 41. For example, in a case of having a mechanism where the signal charges generated at the photoelectric converter 13 are discarded, the sensitivity may be 0 even though the quantum efficiency is finite. The act of accumulating signal charges that is generated by the photoelectric converter 13 irradiated by light, in the charge accumulation region 41, is referred to as exposure.

The act including a first exposure, a temporary stop of exposure, and a second exposure is referred to as multiple exposure. In the multiple exposure, after the first signal charge is accumulated in the charge accumulation region 41 by the first exposure, the exposure is temporarily stopped with the first signal charge held at the charge accumulation region 41. Thereafter, accumulation of a second signal charge generated by the second exposure is started in the charge accumulation region 41 in addition to the first signal charge. Stopping exposure can be realized by stopping light irradiation, or setting sensitivity to 0. Setting sensitivity to 0 can be realized by setting quantum efficiency to 0, or by not accumulating signal charges generated at the photoelectric converter 13 in the charge accumulation region 41. Note that multiple exposure may include third and subsequent exposures.

The imaging device 101 has functions to change its sensitivity to predetermined values according to setting by the sensitivity setting circuit 104. The sensitivity set in the imaging device 101 may be discrete values. Alternatively, the sensitivity set in the imaging device 101 may be, depending on the case, continuous values. In a case of replicating convolution processing by software according to a conventional calculator, the former is desirable. The latter can perform processing similar to the convolution processing by software according to a conventional calculator.

In a case of replicating convolution processing by software, the number of types of sensitivity that can be set to the imaging device 101 basically needs to be no less than the number of types of absolute values of element values in the filter for performing convolution. For example, in the case of the filter illustrated in FIG. 1, the absolute values of element values in the filter is the three types of {0, 1, 2}. In this case, the sensitivity of the imaging device 101 needs to be able to set to {sensitivity 0, standard sensitivity, double standard sensitivity}. The standard sensitivity here means sensitivity that is used as a reference for performing convolution imaging one time, and a different sensitivity may be used as the reference sensitivity in different convolution imaging. For example, the reference sensitivity may be changed in accordance with the brightness of the subject, the imaging speed that is necessary, or the like. Of the sensitivities necessary for the imaging device 101, the sensitivity 0 can be substituted by a later-described shutter function, and accordingly does not have to be able to be set.

The imaging device 101 may have negative sensitivity. In a case that the imaging device 101 is set to a negative sensitivity, the imaging device 101 has a function to remove signal charge from the charge accumulation region 41 in proportion to the intensity of light by which the photoelectric converter 13 is irradiated. Note however, that the aforementioned negative sensitivity is not indispensable in the present disclosure.

The charge accumulation region 41 has a function of continuously accumulating signal charges regardless of change of the sensitivity of the imaging device 101. That is to say, multiple exposure can be performed at different sensitivities. Alternatively, the charge accumulation region 41 may have a function of continuously accumulating signal charges in a case where sensitivity is continuously changed without interrupting irradiation of the imaging device 101 by light.

The sensitivity in the imaging device 101 may be changed to the same value at all pixels. Alternatively, the sensitivity of each pixel may be changed to different values, independently from that of other pixels, or the sensitivity of each block of pixels may be changed to different values, independently from that of other blocks. Alternatively, the sensitivity of a photoelectric converter 13 included in each pixel cell 10 may be changed to different values, independently from that of the other converter 13.

The changing of sensitivity desirably is substantially isochronous at all pixel cells 10. That is to say, changing of sensitivity of the pixels by the sensitivity setting circuit 104 desirably is started and completed substantially at once.

However, isochronicity is not indispensable, and the start and completion time of changing sensitivity may be different for each pixel cell 10. In this case, the imaging system 100 desirably has functions for performing exposure only during periods during which all pixel cells 10 are at a predetermined sensitivity. That is to say, the imaging system 100 desirably has a function to allow the imaging device 101 to be irradiated by light only in a case where all pixel cells 10 are at a predetermined sensitivity, or a function to allow signal charges generated at the photoelectric converter 13 to be accumulated only in a case where all pixel cells 10 are at a predetermined sensitivity. A function where exposure is performed only during a desired period is called a shutter mechanism. Transitioning to a state where exposure can be performed is referred to as opening the shutter. Transitioning to a state where exposure cannot be performed is referred to as closing the shutter. Shielding the imaging device 101 from irradiation of light is realized by the mechanical shutter 107 illustrated in FIG. 7. The mechanism of controlling accumulation of signal charges is referred to as an electronic shutter.

Figure 10:
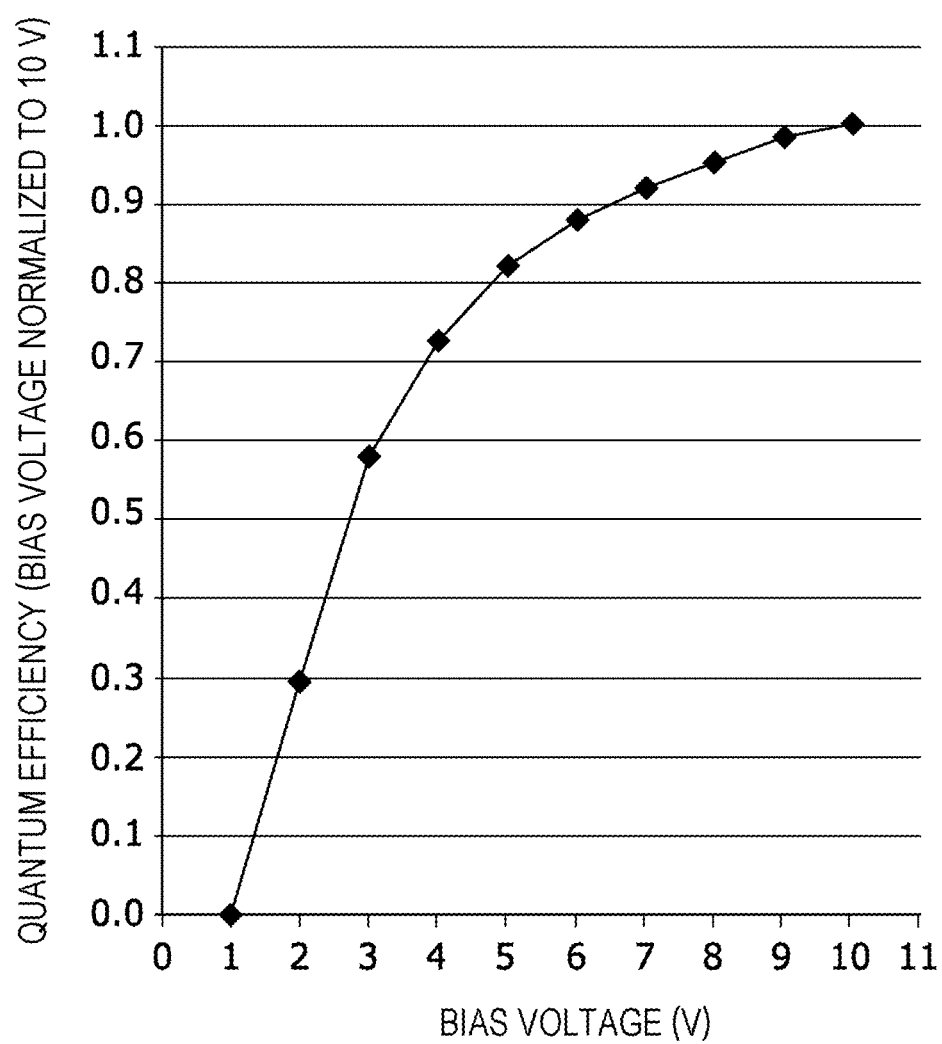
FIG. 10 is a diagram illustrating an example of bias voltage dependency of the sensitivity of the imaging device according to the first embodiment.

As for an imaging device 101 that is capable of changing sensitivity in accordance with the present embodiment, there is the imaging device 101 that uses the layered photoelectric converter 13 in which the pixel electrode 11, photoelectric conversion layer 15, and opposing electrode 12 have been layered as illustrated in FIG. 9. There are, among the photoelectric converters 13, elements where the element sensitivity can be continuously changed from substantially 0 to a finite value, in accordance with voltage applied across the pixel electrode 11 and the opposing electrode 12. An example of a characteristics diagram regarding the relation between applied voltage and sensitivity is illustrated in FIG. 10.

Having the opposing electrode 12 in common among all photoelectric converters 13 enables the sensitivity of all photoelectric converters 13 to be changed at once with isochronicity, simply by changing the voltage of the opposing electrode 12. In this case, the sensitivity setting circuit 104 has voltage setting functions for the opposing electrode 12. The sensitivity setting circuit 104 controls the voltage supply circuit 32 to supply sensitivity control voltage to the photoelectric converter 13 via the sensitivity control line 42 and opposing electrode 12.

The opposing electrode 12 may have a plurality of sections, with voltage being able to be changed for each section. Combining an imaging device 101 configured in this way with an imaging optical system such as a fly eye lens which images a plurality of images of a subject enables convolution imaging to be performed at once for a plurality of filters.

The sensitivity of the layered photoelectric converter can also be changed by controlling the voltage at the pixel electrode 11 side or a third electrode (omitted from illustration), instead of the opposing electrode 12. In this case, the pixel electrodes 11 are independent for each photoelectric converter 13, and accordingly, the sensitivity can be changed individually for each photoelectric converter 13. Using the third electrode that is disposed near the pixel electrode 11 and that can change the voltage for each photoelectric converter 13 enables the sensitivity to be individually changed for each photoelectric converter 13 in the same way.

In the case of the imaging device described above, there is a need for lines to supply voltage to each pixel electrode 11 or each third electrode, to enable sensitivity to be set individually for each photoelectric converter 13. There are cases where it is physically difficult to extend lines for supplying voltage to the plurality of pixel electrodes 11 or third electrodes of all photoelectric converters 13 to the outside of the imaging device 101. In this case, a so-called selection transistor is disposed. The lines selected by this selection transistor are sequentially switched, whereby the multiple pixel electrodes 11 or third electrodes are sequentially connected to the outside. Thus, the voltage of the connected electrodes can be set to optional values.

Alternatively, photoelectric converters 13 may be grouped into sets. In each of the sets, the sensitivity of the photoelectric converters 13 included in the set is determined to be set to the same, and the photoelectric converters 13 included in the set is connected to the same external single line. This enables the number of external signal lines to be reduced.

The imaging system 100 has a signal charge amount measuring instrument for measuring the amount of signal charges accumulated in each charge accumulation region 41. The signal charge amount measuring instrument may be provided to each charge accumulation region 41, or the charge accumulation regions 41 share the signal charge amount measuring instrument and measurement is performed by switching. This signal charge amount measuring instrument is equivalent to, for example, the signal detection circuit 14 illustrated in FIG. 8.

The signal charge amount measuring instrument may discharge signal charges in the charge accumulation region 41 by the measurement operation of the amount of signal charges. That is to say, destructive readout may be performed. Alternatively, the signal charge amount measuring instrument may save the signal charges in the charge accumulation region 41 by the measurement operation of the amount of signal charges. That is to say, nondestructive readout may be performed. The imaging system 100 also has functions of eliminating signal charges accumulated in the charge accumulation region 41, as necessary. The imaging system 100 also has functions of measuring the remaining charge amount after having eliminated signal charges form the charge accumulation region 41, as necessary. A specific configuration of these configurations is the configuration described in FIG. 8, for example.

The imaging system 100 has the storage region 109 that stores the measurement results of the amount of signal charges in each charge accumulation region 41 that have been measured by the signal charge amount measuring instrument, as necessary. In a case where the filter used for convolution has both positive and negative elements, and the imaging device 101 does not have negative sensitivity, the imaging system 100 desirably has the storage region 109.

The imaging system 100 has the computing circuit 108 that performs computing based on the values of the storage region 109, as necessary. The storage region 109 may be provided within this computing circuit 108, for example, or within the imaging device 101.

The imaging optical system 102 has a function imaging an image of the subject on the imaging device 101. The imaging optical system 102 may be a refractive optical system using lenses or the like, or may be a reflective optical system using curved mirrors or the like. Alternatively, the imaging optical system 102 may be a combined type of both. The imaging optical system 102 may include elements such as a diaphragm, filter, or the like, as necessary.

The mechanical shutter 107 controls whether or not the imaging device 101 is to be irradiated by light. However, in a case where the sensitivity of the imaging device 101 can be set to 0, or the sensitivity is not 0 but accumulation of signal charges to the charge accumulation region 41 can be stopped, i.e., in a case where the imaging device 101 has an electronic shutter function and also the electronic shutter has isochronicity at all pixel cells 10, the imaging system 100 does not have to include the mechanical shutter 107.

The position setting unit 103 has functions of changing the relative position of the image of the subject and the imaging device 101 to a predetermined position, based on control by the position setting circuit 105. The change in relative position that is necessary in the present embodiment is change where the imaging device 101 moves relatively over a plane where the image of the subject imaged by the imaging optical system 102 exists. That is to say, this change is change in a direction perpendicular to the optical axis of the imaging optical system 102.

The layout distance among the pixel cells 10 is the reference for the relative position. That is to say, the relative position is set using an integer multiple of the center-to-center distance between two adjacent pixel cells 10 as an increment. In the present embodiment, a position of the image formed by the optical system when the image is moved to the right from a reference position by one pixel layout distance in the row direction is written as (+1, 0). The reference position is a position used as a reference for the relative position between the image of the subject and the imaging device 101. A position of the image when the image is moved to the left from the reference position by one pixel layout distance in the row direction is written as (−1, 0). A position of the image when the image is moved upward from the reference position by one pixel layout distance in the column direction is written as (0, +1). A position of the image when the image is moved downward from the reference position by one pixel layout distance in the column direction is written as (0, −1).

Other positions are also written in the same way. That is to say, position (+2, −1) indicates a position of the image when the image is moved from the reference position by double of one pixel layout distance to the right in the row direction and one pixel layout distance downward in the column direction. This holds true for the others as well.

Figure 11:
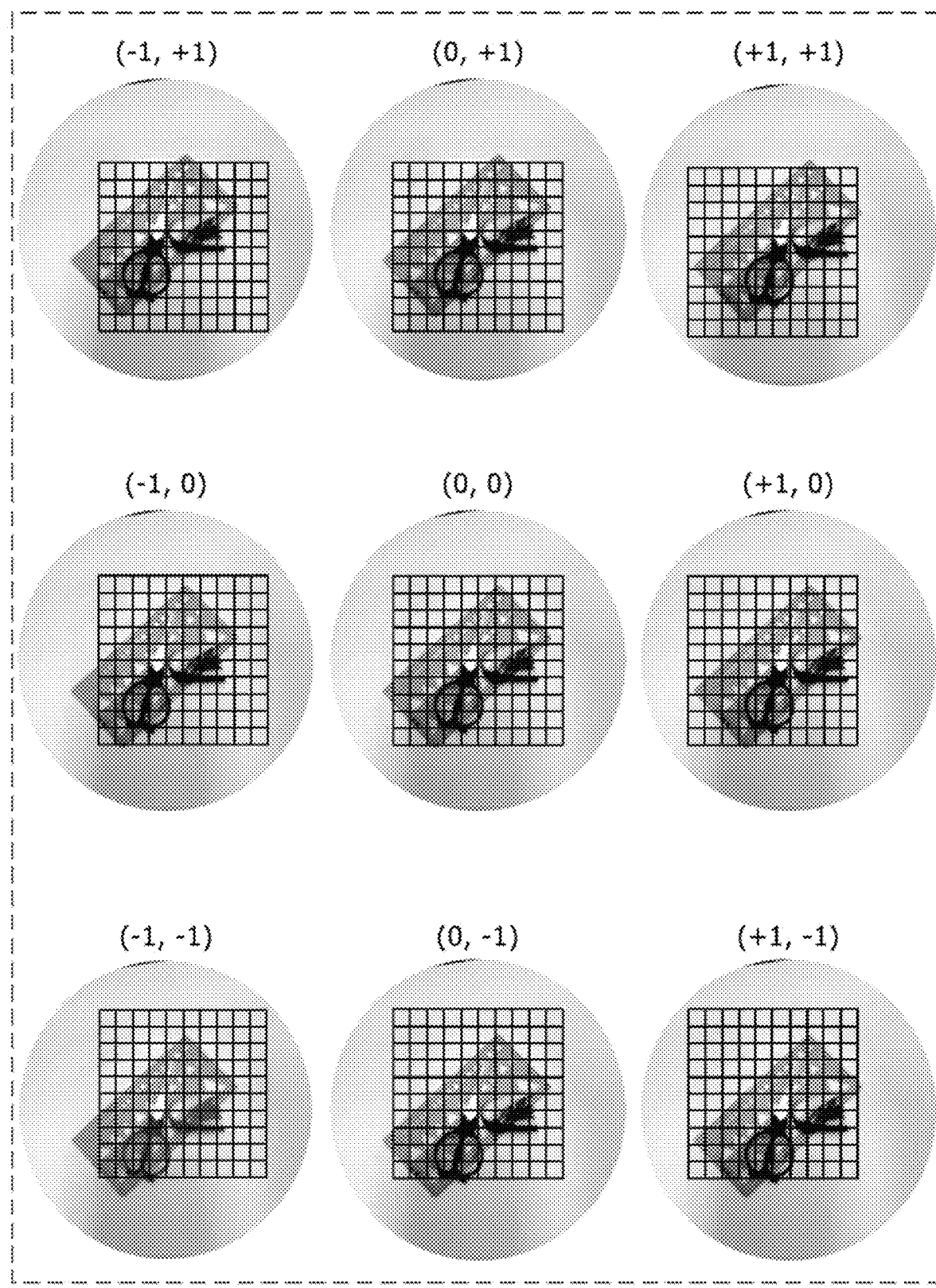
FIG. 11 is a diagram illustrating an example of a relative position according to the first embodiment.

For example, in order to replicate convolution by any filter having (3×3) elements, the nine types {(−1, −1), (−1, 0), (−1, +1), (0, −1), (0, 0), (0, +1), (+1, −1), (+1, 0), (+1, +1)} of positions are required. FIG. 11 illustrates an example of such relative positions.

In the same way, in order to replicate convolution by any filter having (5×5) elements, the 25 types {(−2, −2), (−2, −1), (−2, 0), (−2, +1), (−2, +2), (1, −2), (−1, −1), (−1, 0), (−1, +1), (−1, +2), (0, −2), (0, −1), (0, 0), (0, +1), (0, +2), (+1, −2), (+1, −1), (+1, 0), (+1, +1), (+1, +2), (+2, −2), (+2, −1), (+2, 0), (+2, +1), (+2, +2)} of predetermined positions are required. Note however, that in a case where an element of 0 is included in the filter, the position corresponding to that element does not need to be included in the settable predetermined positions.

The position setting unit 103 desirably has a function to keep the relative position between the image of the subject and the imaging device 101 for a predetermined time after the relative position has been changed. However, this storing function is not indispensable, and a mechanism may be used where the relative position is continuously changed, as in simple harmonic motion. Details of this will be described in a third embodiment.

The position setting unit 103 is an actuator. For example, the position setting unit 103 is a mechanism that physically changes the position of the imaging device 101 by a moving part such as a stepping motor, piezoelectric device, or the like. Note that the position setting unit 103 may be a mechanism that physically changes the position of the entire imaging optical system 102 or part of the components thereof. The position setting unit 103 may be a mechanism that is disposed between the imaging optical system 102 and imaging device 101 and shifts the optical path, or the like. Examples of mechanisms to shift the optical path include a mechanism that changes the angle or position of a mirror, and a mechanism that changes the position or angle of a transparent optical element that shifts light rays passing through.

The position setting unit 103 can be realized by a mechanical configuration that is almost the same as a mechanism for maintaining the relative distance between the image of the subject and the imaging device 101, that has conventionally been used to suppress shaking. Note that in the present embodiment, in a situation where shaking can be expected, the position where shaking correction is performed can be taken as the reference position, and operations be performed to move the relative position additionally therefrom.

The following is description of an example of an imaging method by the above-described imaging system 100, where an image with convolution processing having been performed can be obtained with less calculation amount than conventionally. Note that in the following, change of sensitivity is isochronous.

The filter has a size of $F\_x \times F\_y$. The values of the elements of the filter are written as $F(i, j)$. Note that $F\_x$ and $F\_y$ each are integers that are 2 or greater, i is integers from 1 to $F\_x$, and j is integers from 1 to $F\_y$.

For example, $F(1, 1)$ is the value of an element at the upper left corner of the filter, and $F(F\_x, F\_y)$ is the value of an element at the lower right corner. In the example in FIG. 1, this is $F(1, 1)=1$, $F(1, 2)=0$, $F(1, 3)=-1$, ..., $F(3, 3)=-1$. The i, j that give the center of the filter are $i=C\_x$, $j=C\_y$, respectively. In the example in FIG. 1, this is $C\_x=2$, $C\_y=2$.

Figure 12:
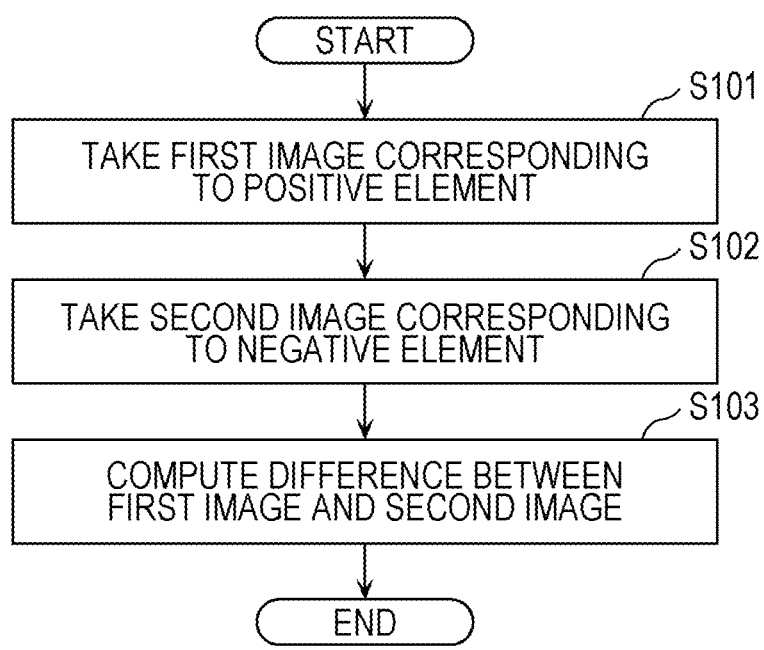
FIG. 12 is a flowchart illustrating imaging procedures according to the first embodiment.

FIG. 12 is a flowchart illustrating schematics of imaging processing according to the present embodiment. First, the imaging system 100 takes a first image corresponding to elements having positive values in the filter (S101).

Next, the imaging system 100 takes a second image corresponding to elements having negative values in the filter (S102). Finally, the computing circuit 108 subtracts the second image from the first image, thereby yielding an image equivalent to an image after convolution processing.

Figure 13:
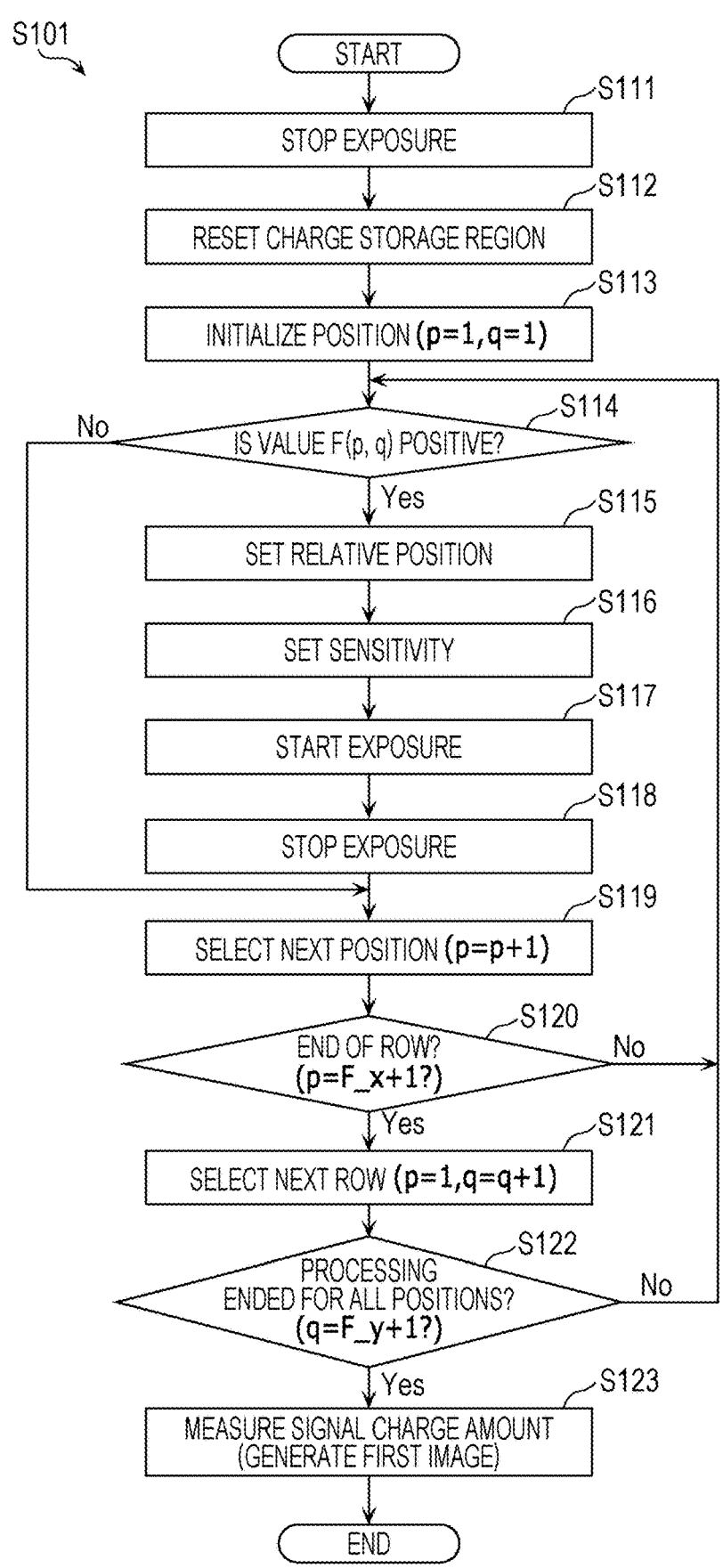
FIG. 13 is a flowchart illustrating imaging procedures according to the first embodiment.

FIG. 13 is a flowchart illustrating step S101 in detail. First, the imaging system 100 stops exposure, or confirms that exposure is stopped (S111). This may be performed by the mechanical shutter 107 or by electronic shutter. That is to say, the imaging system 100 may physically shield the imaging device 101 from being irradiated by light, or may stop the act of accumulating signal charges generated at the photoelectric converter 13 in the charge accumulation region 41. Alternatively, the imaging system 100 may set the sensitivity of the imaging device 101 to 0.

This processing is performed to prevent the results of exposure before the exposure in step S117, or the effects of an uncontrolled state, from affecting the charge accumulation region 41. Accordingly, step S111 can be omitted if it can be ensured that the results of exposure before the exposure in step S117 or the effects of an uncontrolled state will not affect the charge accumulation region 41 or will be substantially negligible.

Next, the imaging system 100 resets each charge accumulation region 41, or confirms that the charge accumulation region 41 has been reset (S112). This processing is performed to correctly measure the amount of signal charges generated by exposure after step S113. Accordingly, resetting can be any act that enables the amount of signal charges generated by exposure after step S113 to be correctly measured, besides setting the amount of signal charges to 0. For example, processing may be performed as resetting where the amount of charges already accumulated in the charge accumulation region 41 before the exposure after step S117 is detected, and the detected value is recorded and so forth.

Next, the imaging system 100 initializes the position of the element that is the object of processing out of the elements in the filter (hereinafter referred to as position of interest) (S113). For example, the imaging system 100 sets p=1, q=1. Here, p and q are variables provided for convenience of counting the elements of the filter. Note that p=1, q=1 indicates the upper left corner of the filter. That is to say, the upper left corner of the filter is selected as the position of interest.

Next, the imaging system 100 determines whether the coefficient value $F(p, q)$ at the position of interest is positive or not (S114). In a case where the value $F(p, q)$ is positive (Yes in S114), the imaging system 100 sets the relative position between the image of the subject and the imaging device 101 (S115). Specifically, the position setting circuit 105 controls the position setting unit 103 so that the relative position is $(C\_x-p, q-C\_y)$.

Next, the sensitivity setting circuit 104 sets the sensitivity of all pixel cells 10 of the imaging device 101 to |(reference sensitivity)×$F(p, q)$| (S116). Note that in a case where the imaging device 101 can realize negative sensitivity, the sensitivity setting circuit 104 sets the sensitivity of all pixel cells 10 to (reference sensitivity)×$F(p, q)$. Note that in a case where the $F(p, q)$ is the same as in the previous step S116, the processing of setting sensitivity is performed by maintaining the sensitivity, for example.

Next, the imaging system 100 starts exposure (S117). Specifically, in a case where the imaging system 100 has the mechanical shutter 107, the imaging system 100 opens the mechanical shutter 107. In a case where the state is that signal charges generated at the photoelectric converter 13 are not accumulated at the charge accumulation region 41, the imaging system 100 changes this to a state where the signal charges are accumulated. That is to say, the imaging system 100 starts exposure at the relative position set in step S115 and the sensitivity set in step S116. Thus, accumulation of signal charges to the charge accumulation region 41 is started.

Next, after a predetermined amount of exposure time has elapsed, the imaging system 100 stops exposure (S118). Specifically, in a case of having detected that the predetermined amount of exposure time has elapsed from the start of exposure, the imaging system 100 sets the sensitivity of the imaging device 101 to 0. Alternatively, the imaging system 100 shuts the mechanical shutter or electronic shutter.

In a case where the value $F(p, q)$ is negative or zero in step S114 (No in S114), or after step S118 has been performed, the imaging system 100 selects a next position as the position of interest. Specifically, the imaging system 100 increments the variable p by 1. Thus, the position to the right side of the immediately-previous position of interest is selected as the position of interest.

Next, the imaging system 100 determines whether the position selected immediately before is the end of the row (S120). Specifically, the imaging system 100 determines whether or not p=F_x+1 holds. In a case where the position that was selected immediately before is not the end of the row, i.e., p=F_x+1 does not hold (No in S120), the imaging system 100 performs the processing of step S114 and thereafter on the position of interest set in step S119.

On the other hand, in a case where the position that was selected immediately before is the end of the row, i.e., p=F_x+1 holds (Yes in S120), the imaging system 100 selects position at the start (left edge) of the next row as the position of interest (S121). Specifically, the imaging system 100 sets p=1, q=q+1.

Next, the imaging system 100 determines whether processing of all positions has ended (S122). For example, the imaging system 100 determines whether the row that had been selected immediately before is the last row. Specifically, the imaging system 100 determines whether q=F_y+1 holds or not.

In a case where processing of all position has not ended, i.e., in a case where q=F_y+1 does not hold (No in S122), the imaging system 100 performs the processing of step S114 and thereafter on the position of interest set in step S121.

In the other hand, in a case where the processing of all positions has ended, i.e., in a case where q=F_y+1 holds (Yes in S122), the imaging system 100 measures the signal charge amount (S123). Specifically, the imaging system 100 measures the amount of charges accumulated in the charge accumulation regions 41 using the signal charge amount measuring instrument, and stores the obtained results (first image) in the storage region. According to this processing, multiple exposure of positive elements in the filter is completed, and a first image is obtained.

Figure 14:
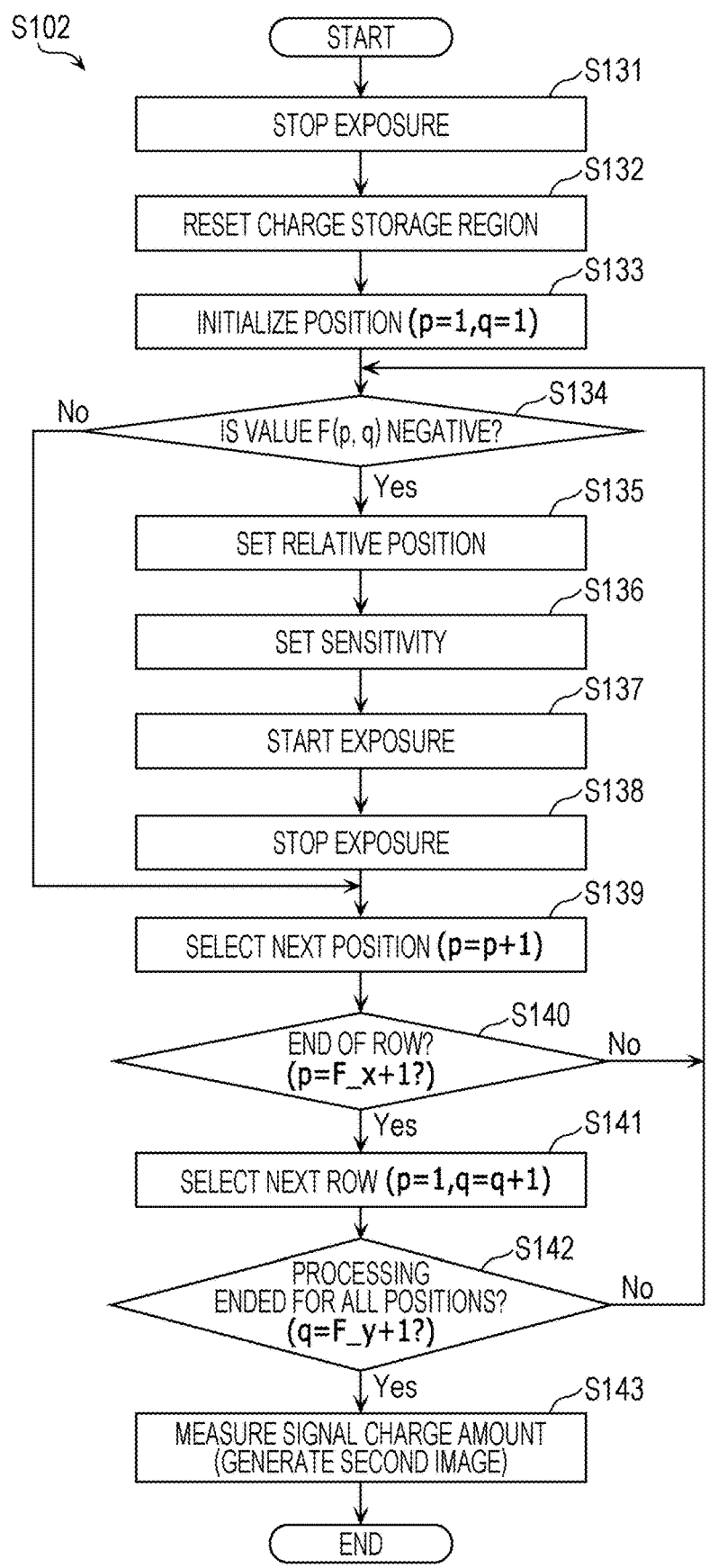
FIG. 14 is a flowchart illustrating imaging procedures according to the first embodiment.

Next, processing of multiple exposure corresponding to elements having negative values in the filter (S102) will be described. FIG. 14 is a flowchart of this processing. Note that the processing in steps S131 through S133 and S135 through S143 are the same as the processing in steps S111 through S113 and S115 through S123 illustrated in FIG. 13, so the description thereof will be omitted.

In step S134, the imaging system 100 determines whether the filter coefficient value F(p, q) is negative or not (S134). In a case where the value F(p, q) is negative (Yes in S134), the flow transitions to step S135, and in a case where the value F(p, q) is not negative (No in S134), the flow transitions to step S139.

Multiple exposure of elements having negative values in the filter is performed by the processing illustrated in FIG. 14, and a second image is generated. The second image that has been generated is stored in the storage region as well.

The difference between the first image and second image stored in the storage region is then calculated in step S103 illustrated in FIG. 12. In a case where the coefficient value at the position of interest is neither positive nor negative, i.e., zero, exposure is not performed.

Figure 15:
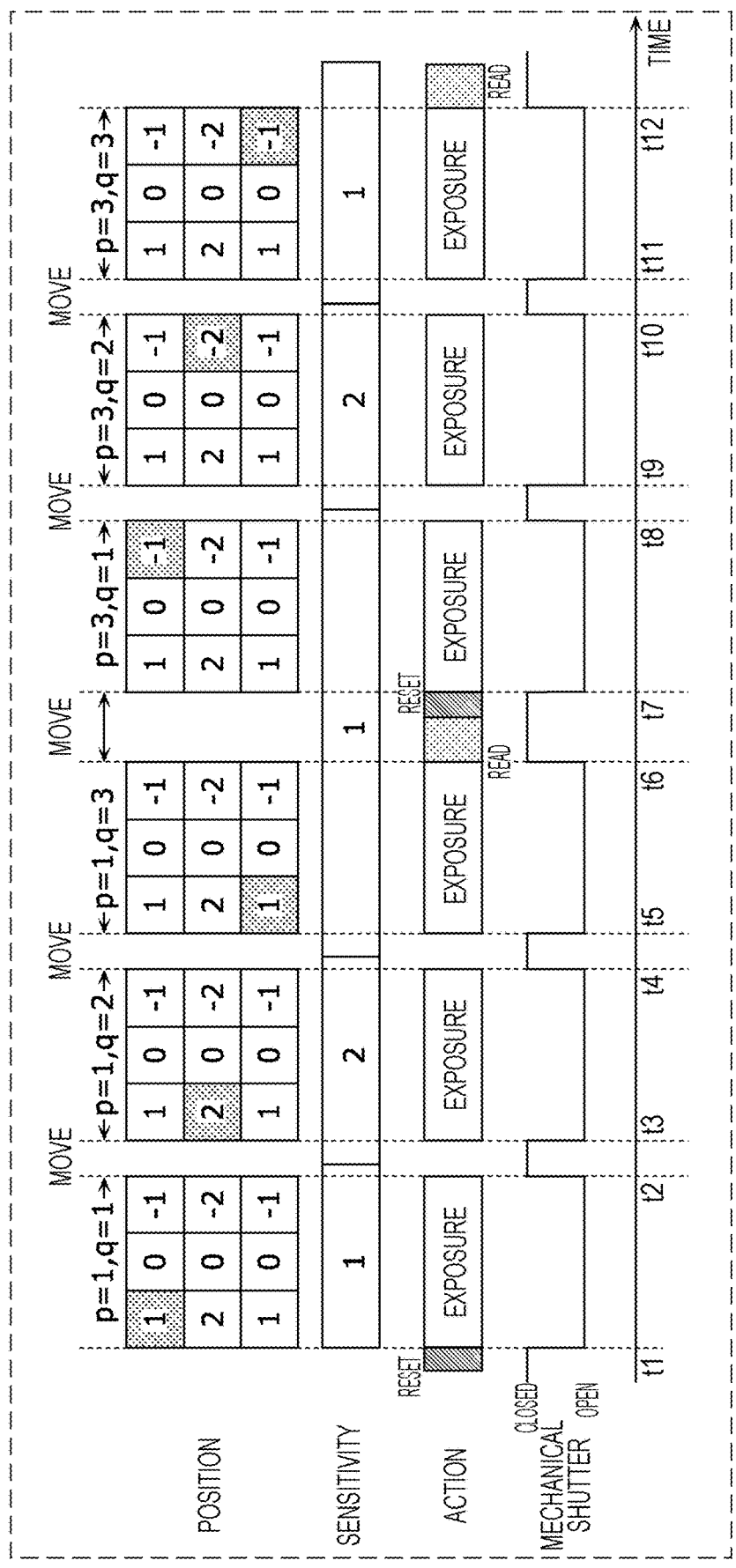
FIG. 15 is a timing chart illustrating an example of the flow of imaging processing according to the first embodiment.

FIG. 15 is a timing chart illustrating the flow of imaging processing in a case of using the filter illustrated in FIG. 1. Note that FIG. 15 is a diagram schematically illustrating the content of image processing, and may not necessarily agree with processing carried out with regard to scale of the temporal axis and so forth.

As illustrated in FIG. 15, at time t1 after resetting, the upper left of the filter (p=1, q=1) is selected as the position of interest, the relative position is set to 1, −1), and the sensitivity is set to 1 (reference sensitivity×1). Exposure is performed from time t1 to time t2 in this state.

Next, the mechanical shutter 107 is closed from time t2 to t3, so the state is a no-exposure state. Changing of the relative position and sensitivity is performed during this time t2 to t3. Note that the timing at which the changing of relative position and changing of sensitivity may be performed at any timing as within this period.

During time t2 to t3, the middle left of the filter (p=1, q=2) is selected as the position of interest, the relative position is set to (1, 0), and the sensitivity is set to 2 (reference sensitivity×2). Exposure is performed from time t3 to time t4 in this state. That is to say, in addition to signal charges obtained by the exposure of time t1 through t2, signal charges obtained in time t3 through t4 are accumulated in the charge accumulation region 41.

In the same way, during time t4 to t4, the lower left of the filter (p=1, q=3) is selected as the position of interest, the relative position is set to (1, 1), and the sensitivity is set to 1 (reference sensitivity×1). Exposure is performed from time t5 to time t6 in this state. That is to say, in addition to signal charges obtained by the exposure of time t1 through t2 and time t3 through t4, signal charges obtained in time t5 through t6 are accumulated in the charge accumulation region 41.

At time t6, signals corresponding to these signal charges (first image) are read out. The second image corresponding to negative elements is generated during time t7 through t12 by similar processing, and the second image is read out.

Figure 16:
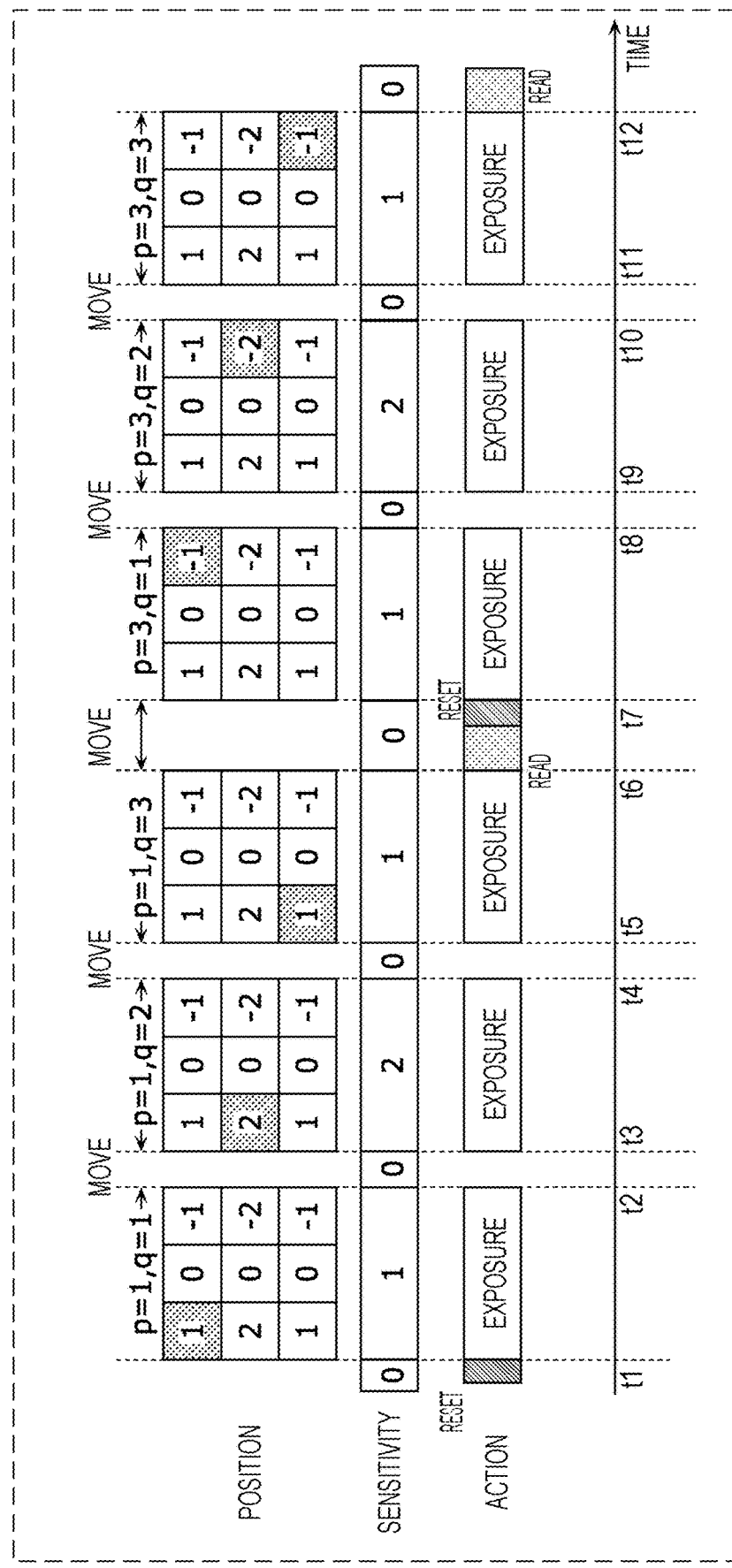
FIG. 16 is a diagram illustrating an example of the flow of imaging procedures according to the first embodiment.

Although an example has been illustrated in FIG. 15 where the mechanical shutter 107 is used, an arrangement may be made where the sensitivity is set to zero instead of closing the mechanical shutter 107, as illustrated in FIG. 16.

As described above, the imaging system 100 according to the present embodiment can obtain basically the same image as the results of having performed convolution by software on an image taken at reference sensitivity. The only computation that is necessary in the above procedures is computation of difference for the count of pixels. That is to say, the amount of computation can be reduced as compared to conventional convolution processing using software. In a case of convolution using a filter where the filter elements are only positive or only negative, even the computation of difference is unnecessary.

Multiple exposure changing the relative position between the image of the subject and the imaging device 101 in the above-described procedures is equivalent to adding multiple pixels obtained as a result of imaging with the relative position of the image of the subject and the imaging device 101 unchanged. Changing sensitivity at the time of multiple exposure is equivalent to multiplying filter coefficients. Accordingly, convolution imaging can be performed by the above-described method.

According to the method of the embodiment described above, the same imaging can be performed regarding any filter simply by changing instructions to the sensitivity setting circuit 104 and position setting circuit 105. Convolution using a plurality of filters regarding a particular subject can be performed by changing instructions to the sensitivity setting circuit 104 and position setting circuit 105 and repeating the above procedures.

In the method according to the present embodiment described above, the time required for imaging is hardly dependent on the number of pixels, except for step S103.

Step S103 is only difference computation, so the calculation load is small. The greater the number of pixels is, and the more filters used for convolution, the greater the amount of necessary time is reduced, compared to the conventional method.

By forming the size of the image of the subject created by the imaging optical system 102 to be sufficiently larger than the imaging device 101, the image of the subject can constantly cover the entire imaging device even if the relative position of the image of the subject and the imaging device 101 is changed. This solves the problem where correct computation could not be performed due to the filter extending past the peripheral portions of the image, which has occurred in the conventional method of performing convolution on the results of imaging.

As described above, the imaging system 100 according to the present embodiment has the imaging optical system 102 that images an image of a subject, the imaging device 101 including the plurality of pixel cells 10 laid out two-dimensionally on the row direction and column direction, the position setting circuit 105 that sets the relative position of the plurality of pixel cells 10 and the image of the subject based on first control signals 112, the sensitivity setting circuit 104 that sets the sensitivity of each of the plurality of pixel cells 10 based on second control signals 111, and the synchronization circuit 106 that synchronizes the first control signals 112 and second control signals 111. Each of the plurality of pixel cells 10 has a photoelectric converter 13 that converts light into signal charges, and a charge accumulation region 41 that accumulates signal charges obtained at the photoelectric converter 13.

The charge accumulation region 41 adds, to signal charges obtained by the photoelectric converter 13 in a state where the relative position is set to a first relative position and the sensitivity is set to a first sensitivity, accumulation of signal charges obtained by the photoelectric converter 13 in a state where the relative position is set to a second relative position that is different from the first relative position and the sensitivity is set to a second sensitivity that is different from the first sensitivity.

According to this, the imaging system 100 can obtain an image where signal charges obtained at different relative positions and different sensitivities have been added, while changing the relative position of the plurality of pixel cells 10 and the image of the subject, and changing the sensitivity of the plurality of pixel cells 10. Accordingly, at least part of convolution computation processing can be performed by the imaging device 101, so the amount of computation for convolution processing can be reduced.

The position setting circuit 105 sets the relative position in increments of an integer multiple of the pixel pitch. Accordingly, the imaging system 100 can improve replicability of convolution computation.

The sensitivity setting circuit 104 sets the sensitivity of the plurality of pixel cells 10 at once. Accordingly, the imaging system 100 can improve replicability of convolution computation.

The photoelectric converter 13 includes the light-transmitting pixel electrode 11 connected to the charge accumulation region 41, the opposing electrode 12, and the photoelectric conversion layer 15 interposed between the pixel electrode 11 and opposing electrode 12.

The sensitivity of the pixel cell 10 is changed by the voltage applied across the pixel electrode 11 and opposing electrode 12 being changed. Accordingly, the imaging system 100 can change the sensitivity of the pixel cell 10 by changing the voltage applied to the photoelectric converter 13.

As illustrated in FIGS. 13, 15, and so forth, the imaging method according to the present embodiment includes a first relative position setting step of setting the relative position of the imaging optical system 102 and imaging device 101 to a first relative position, a first sensitivity setting step of setting the sensitivity of the plurality of pixel cells 10 to a first sensitivity, a first accumulating step of accumulating a first signal charge obtained at the photoelectric converter 13 in the charge accumulation region 41 in a state where the relative position is set to the first relative position and the sensitivity is set to the first sensitivity, a second relative position setting step of setting the relative position of the imaging optical system 102 and imaging device 101 to a second relative position that is different from the first relative position, a second sensitivity setting step of setting the sensitivity of the plurality of pixel cells 10 to a second sensitivity that is different from the first sensitivity, a second accumulating step of accumulating a second signal charge obtained at the photoelectric converter 13 in the charge accumulation region 41 in addition to the first signals charge, in a state where the relative position is set to the second relative position and the sensitivity is set to the second sensitivity.

According to this, in this imaging method, an image can be obtained where signal charges obtained at different relative positions and different sensitivities have been added, while changing the relative position of the plurality of pixel cells 10 and the image of the subject, and the sensitivity of the plurality of pixel cells 10. Accordingly, at least part of convolution computation processing can be performed by the imaging device 101, so the amount of computation for convolution processing can be reduced.

In the second relative position setting step, the relative position is shifted from the first relative position to the second relative position by shifting in increments of an integer multiple of the pixel pitch. Accordingly, the imaging method can improve replicability of convolution computation.

The imaging system 100 further has the mechanical shutter 107 that shields the imaging device 101 from light. In the second relative position setting step, the relative position is changed from the first relative position to the second relative position in a state where the imaging device 101 is shielded from light by the mechanical shutter 107, as illustrated in FIG. 15 and so forth. Accordingly, exposure is not performed during changing of the relative position in this imaging method, so replicability of convolution computation can be improved.

Alternatively, in the second relative position setting step, the relative position is changed from the first relative position to the second relative position in a state where sensitivity is set to zero, as illustrated in FIG. 16 and so forth. Accordingly, exposure is not performed during changing of the relative position in this imaging method, so replicability of convolution computation can be improved.

As illustrated in FIGS. 12, 13, 15, and so forth, the imaging method includes an N count (where N is an integer of 2 or greater) of setting steps including the first relative position setting step, the second relative position setting step, the first sensitivity setting step, and the second sensitivity setting step, and an N count of accumulating steps including the first accumulating step and the second accumulating step. In an i'th (where i is an integer of 1 or greater but N or smaller) setting step, the relative position is set to an i'th relative position, and the sensitivity is set to an i'th sensitivity. In an i'th accumulating step, signal charges obtained at the photoelectric converter 13 in at the i'th relative position and i'th sensitivity are accumulated in the charge accumulation region 41. The imaging method further includes a computing step of obtaining an image equivalent to an image after predetermined convolution processing, using one or more images obtained by the N count of accumulating steps. The N count of setting steps correspond to respective N coefficients out of the coefficients in convolution processing. An i'th relative position set in the i'th setting step corresponds to a position of a coefficient corresponding to the i'th setting step. An i'th sensitivity set in the i'th setting step corresponds to a coefficient corresponding to the i'th setting step. Accordingly, this imaging method can perform at least part of convolution computation processing by the imaging device 101, so the amount of computation for convolution processing can be reduced.

A first image corresponding to the total value of signals regarding which coordinates in convolution processing are positive, and a second image corresponding to the total value of signals regarding which coordinates in convolution processing are negative, are obtained in the N count of accumulating steps, and an image equivalent to an image following convolution processing can be obtained in the computing step by subtracting the second image from the first image, as illustrated in FIG. 12 and so forth. Accordingly, the imaging method can realize convolution computation processing including negative coefficients.

The N count of setting steps correspond to respective N coefficients of which the value is not zero, out of the coefficients in convolution processing, as illustrated in FIGS. 13, 15, and so forth. That is to say, exposure of coefficients where the value is zero is skipped. Accordingly, imaging time can be reduced.

Second Embodiment

An example has been described in the first embodiment where a first image corresponding to elements having positive values in a filter and a second image corresponding to elements having negative values in the filter are generated, and the difference between the first image and the second image is calculated. In a second embodiment, a separate method of obtaining an image corresponding to a filter will be described. In the present embodiment, the imaging system 100 generates a first image corresponding to a filter where an offset value have been added to all filter elements and a second image corresponding to a filter where all elements have been set to the offset value, and calculates the difference between the first image and second image.

Figure 17:
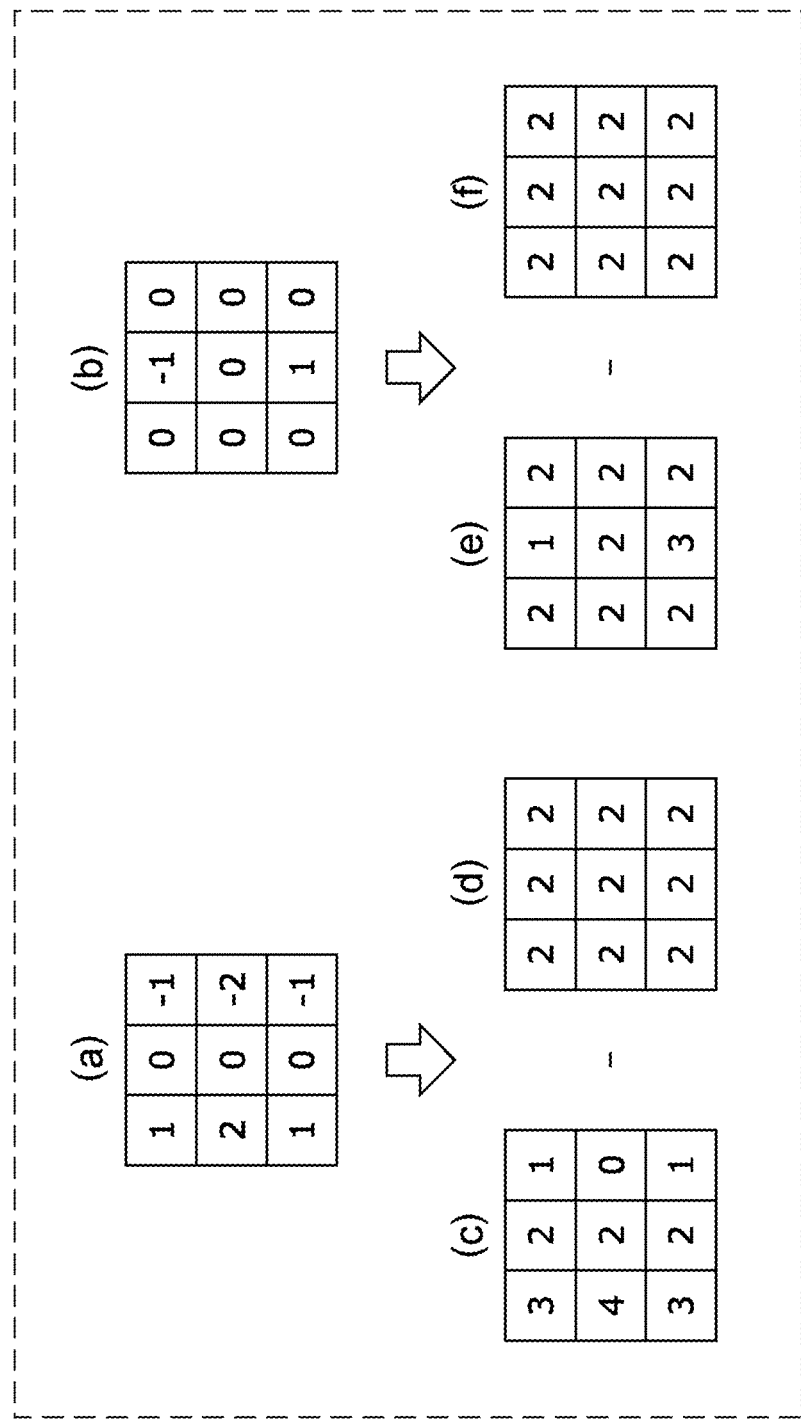
FIG. 17 is a diagram for describing imaging processing according to a second embodiment.

An example of a case of generating images corresponding to two types of filters illustrated in (a) and (b) in FIG. 17 will be described below. First, the largest absolute value of negative coefficients included in these filters is set to an offset value. In the example of FIG. 17, −2 is the negative coefficient having the largest absolute values, so the offset value is set to 2. Note that the offset value may be a value larger than the largest absolute value of negative coefficients.

A filter where the offset value 2 has been added to all elements of the filter ((c) in FIG. 17) and a filter where all elements have been set to the offset value 2 ((d) in FIG. 17) are generated for the filter illustrated in (a) in FIG. 17. Performing the same processing as that in the first embodiment for these two filters yields a first image and a second image. Subtracting the second image from the first image yields the image corresponding to the filter illustrating in (a) in FIG. 17. Note that there is no need to change sensitivity for the filter where all elements have been changed to the offset value 2. In this case, the processing of setting sensitivity is, for example maintaining the sensitivity at the offset value.

Similarly, filter where the offset value 2 has been added to all elements of the filter ((e) in FIG. 17) and a filter where all elements have been set to the offset value 2 ((f) in FIG. 17) are set for the filter illustrated in (b) in FIG. 17. The filters in (d) and (f) in FIG. 17 are the same filter here, so the same image can be used for the second image used for subtraction. Thus, in the technique according to the present embodiment, the second image used for subtraction can be used in common for a plurality of filters, so the number of times of shooting can be reduced.

Figure 18:
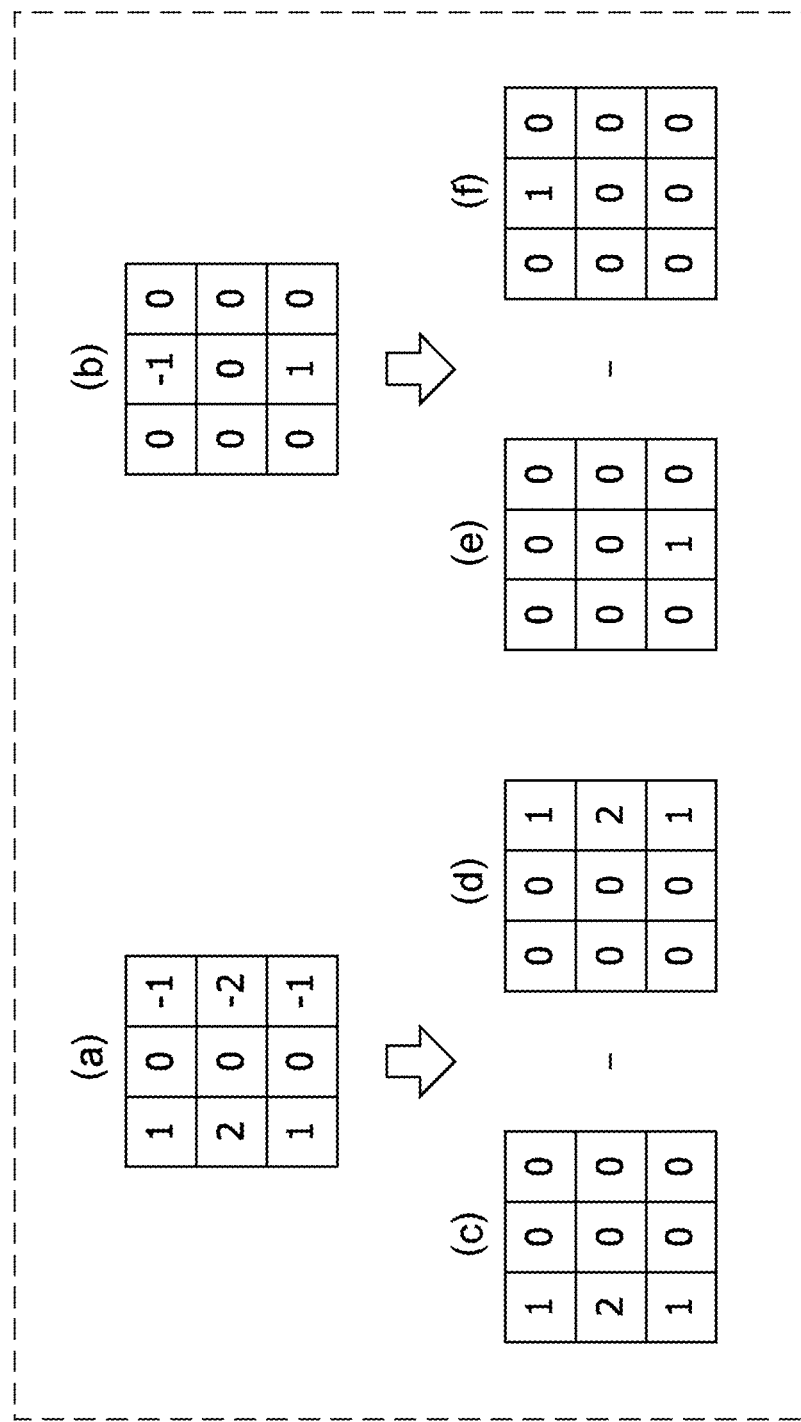
FIG. 18 is a diagram for describing imaging processing according to a second embodiment.

FIG. 18 is a diagram illustrating an example of filters obtained by the technique of the first embodiment. It can be seen from FIG. 18 that two images are necessary for each filter ((a) and (b)) with the technique according to the first embodiment.

On the other hand, exposure at positions where the coefficient is zero can be skipped by using the technique in the first embodiment, as described earlier. Accordingly, there are cases where the shooting time can be reduced with regard to filters containing many coefficient zeros, even in cases where a plurality of filter are used.

Further, as a separate method, a single image containing both positive and negative elements may be generated, instead of shooting two images. Specifically, signal charges corresponding to the amount of exposure can be removed from the charge accumulation region 41 by applying an inverse bias to the photoelectric converter 13. Applying positive and negative voltages to the photoelectric converters 13 corresponding to the positive and negative filter elements enables a single image including both positive and negative elements to be generated.

As described above, in the imaging method according to the present embodiment, sensitivity corresponding to values to which an offset value has been added to the coefficients of convolution processing and sensitivity corresponding to the offset value are set in an N count of setting steps, and a first image and second image are obtained in an N count of accumulating steps. The first image is equivalent to an image following convolution processing using coefficients obtained by adding an offset value to all coefficients in convolution processing. The second image is equivalent to an image after convolution processing using the offset value as all coefficients. In the computing step, the second image is subtracted from the first image, thereby obtaining an image equivalent to an image after convolution processing.

Accordingly, this imaging method can realize convolution computation processing including negative coefficients. The second image can be used in common in a case where multiple images that have been subjected to different convolution processing from each other are obtained, so shooting time can be reduced.

Third Embodiment

Figure 19:
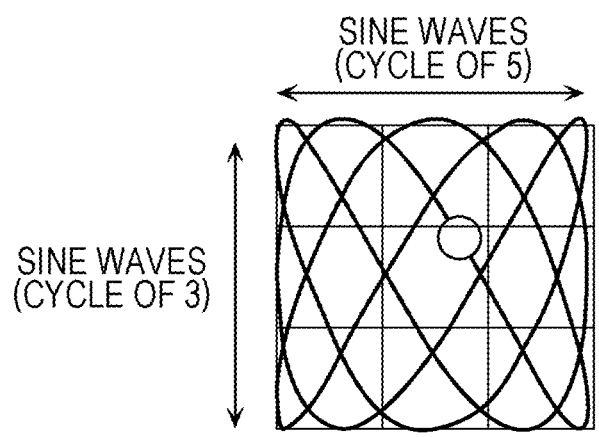
FIG. 19 is a diagram illustrating an example of change in relative position, according to a third embodiment.
Figure 20:
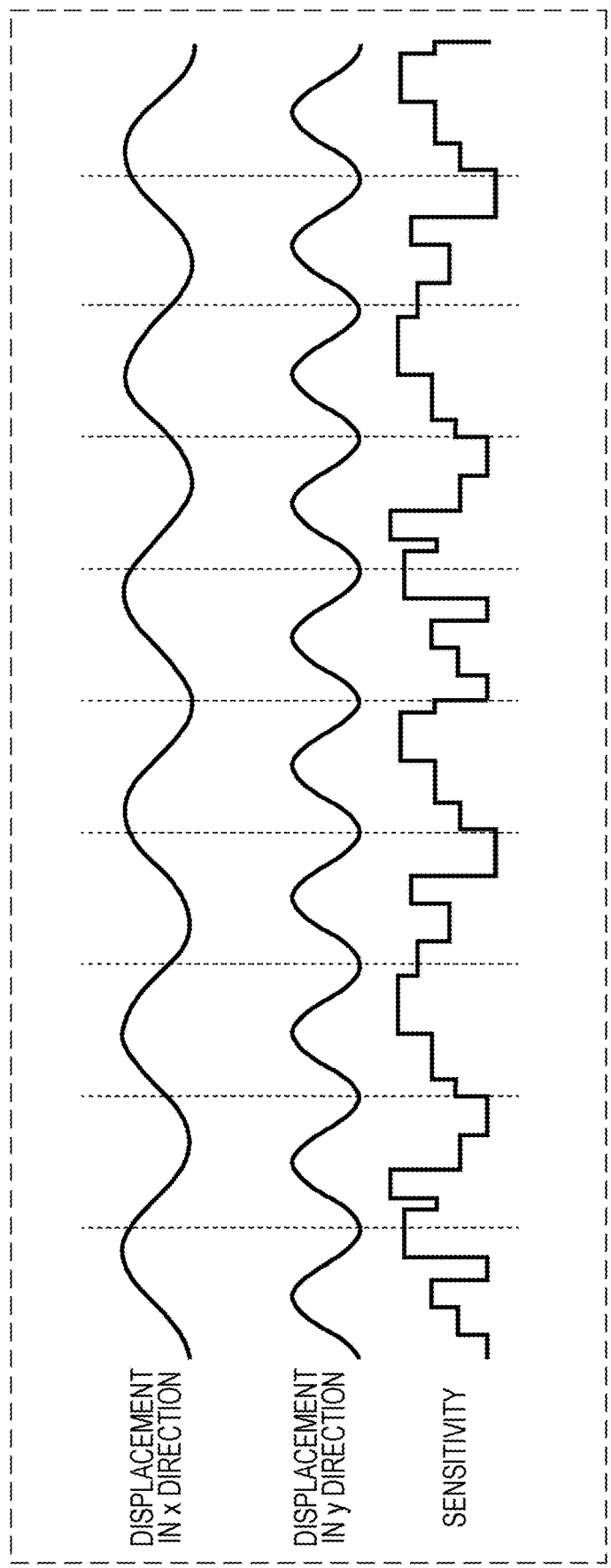
FIG. 20 is a diagram illustrating an example of change in relative position, according to the third embodiment.

An example where the relative position of the image of the subject and the imaging device 101 is moved in increments of an integer multiple of the pixel pitch has been described in the first embodiment, but the relative position may be continuously changed. FIGS. 19 and 20 are diagrams illustrating an example of continuous change of relative position. The frequency of simple harmonic motion in the row direction and the frequency of simple harmonic motion in the column direction are set to different values, as illustrated in FIGS. 19 and 20. Accordingly, the relative position between the image of the subject and the imaging device 101 follows a so-called Lissajous figure, following an orbit that fills in a rectangle made up of the amplitude of rows and columns. In this case, the configuration of the position setting unit 103 can simplified by performing synchronizing control so that the sensitivity is a desired value when the relative position is at a desired position. This is also advantageous in that temporal deviation is averaged out, since the figure passes through sections corresponding to same filter elements multiple times.

Figure 21:
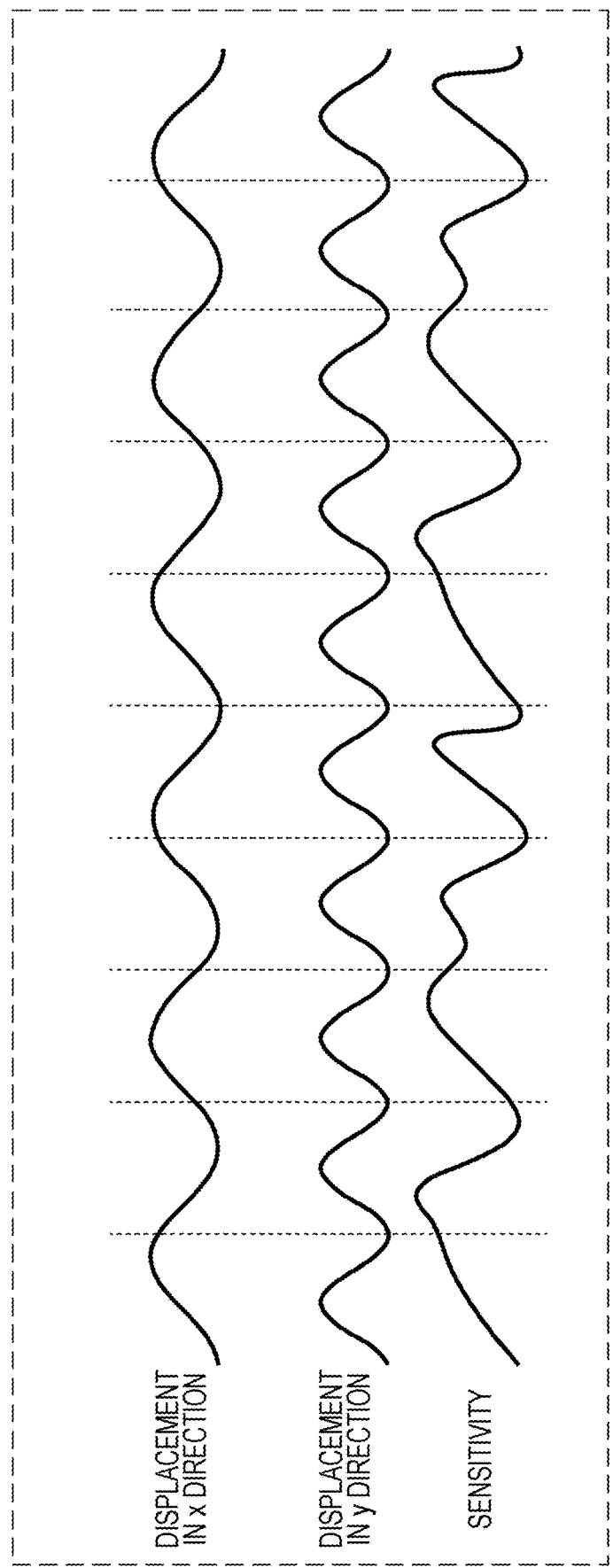
FIG. 21 is a diagram illustrating an example of change in relative position, according to the third embodiment.

Although FIG. 20 shows sensitivity being changed in stages, an arrangement may be made such as illustrated in FIG. 21, where sensitivity is changed continuously in conjunction with the relative position. FIGS. 20 and 21 each illustrate change in relative position and sensitivity during one exposure period. This one exposure period may be divided into multiple.

Thus, in the imaging system 100 according to the present embodiment, the position setting circuit 105 continuously changes the relative position during the exposure period, and the charge accumulation region 41 accumulates signal charges obtained at the photoelectric converter 13 during the exposure period. Accordingly, the imaging system 100 can easily realize change in the relative position between the plurality of pixel cells 10 and image of the subject, and increase in shooting time due to this changing can be suppressed.

The sensitivity setting circuit 104 continuously changes the sensitivity during one exposure period. This, the imaging system 100 can improve replicability of convolution processing. Note that in the present embodiment, the imaging device 101 has positive and negative sensitivity, so there is no need to calculate the difference between the first image and second image. Alternatively, a first image and second image may be generated and the difference of these images calculated in the present embodiment as well, as in the first and second embodiments. That is to say, a first image may be generated in one exposure period, and a second image may be generated in another exposure period.

In a second relative position setting step in the imaging method according to the present embodiment, the relative position is changed continuously from a first relative position to a second relative position. In a second accumulating step, third signal charges obtained by the photoelectric converter are added to first signal charges in the period during which the relative position is being continuously changed, and accumulated in the charge accumulation region 41. Accordingly, this imaging method can easily realize changing of the relative position between the plurality of pixel cells 10 and the image of the subject, and can suppress increase in shooting time due to this changing.

In a second sensitivity setting step, the sensitivity is continuously changed from a first sensitivity to a second sensitivity, and in a second accumulating step, the third signal charges obtained at the photoelectric converter 13 are added to the first signal charges and accumulated in the charge accumulation region 41, during the period where the relative position is being continuously changed and the sensitivity is being continuously changed. Accordingly, this imaging method can improve replicability of convolution computation.

Fourth Embodiment

In a fourth embodiment, description will be made regarding an imaging method using an imaging device 101 where a plurality of photoelectric converters 13 are included in each pixel cell 10 of the imaging device 101, and sensitivity can be independently set for each of the plurality of photoelectric converters 13 included in one pixel cell 10.

The greatest advantage of using the imaging device 101 where the individual sensitivity can be set for each of the plurality of photoelectric converters 13 included in one pixel cell 10 is that convolution imaging using a plurality of filters can be performed at the same time. Alternatively, the imaging time of a filter having positive and negative elements can be reduced. That is to say, if a sufficient number of photoelectric converters 13 is included in one pixel cell 10, a plurality of images corresponding to a plurality of filters can be obtained at the same time.

A case of imaging both the positive and negative components of the two filters illustrated in (a) and (b) in FIG. 18 at the same time will be described blow. A method of extending the number of filters will be self-evident to those skilled in the art, based on the description of the present specification.

Figure 22:
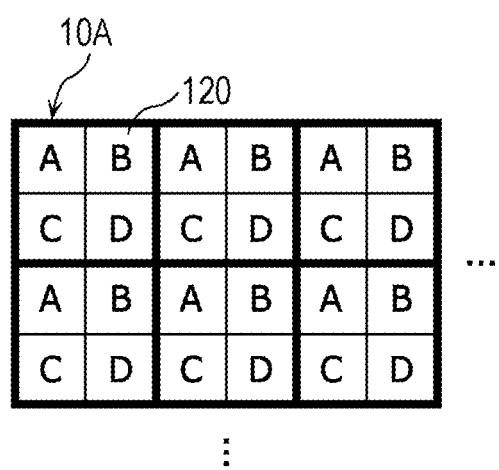
FIG. 22 is a diagram illustrating an example of pixel configurations according to a fourth embodiment.

FIG. 22 is a diagram illustrating the pixel configuration according to the present embodiment. The imaging device 101 includes a plurality of pixel cells 10A, as illustrated in FIG. 22. Each pixel cell 10A includes a plurality of sub-pixels 120. Specifically, in the example illustrated in FIG. 22, the pixel cell 10A includes four sub-pixels 120 (sub-pixels A through D). Note that the configuration of each of the sub-pixels 120 is the same as that of the pixel cell 10 illustrated in FIG. 8, for example. Note that a sub-pixel 120 includes at least the photoelectric converter 13, and the charge accumulation region 41 that accumulates signal charges generated at the photoelectric converter 13. In other words, other elements of the components of the pixel cell 10 illustrated in FIG. 8 may be provided for each sub-pixel 120, or may be provided in common for the plurality of sub-pixels 120.

The present embodiment is configured so that the sensitivity of the sub-pixels A through D can be individually controlled. For example, a configuration is made such that different voltage can be applied to the pixel electrodes 11 of the sub-pixels A through D, as described earlier.

All sub-pixels A included in the plurality of pixel cells 10A are set to the same sensitivity as each other. In the same way, all sub-pixels B included in the plurality of pixel cells 10A are set to the same sensitivity as each other. Also, all sub-pixels C included in the plurality of pixel cells 10A are set to the same sensitivity as each other. Further, all sub-pixels D included in the plurality of pixel cells 10A are set to the same sensitivity as each other.

The elements of the filters will be respectively written as F1(p, q), F2(p, q). The two filters have the same number of elements. The center of the filters is p=C_x, q=C_y for both.

In the following, the four photoelectric converters 13 included in the sub-pixels A through D will be written as photoelectric converter 13A, photoelectric converter 13B, photoelectric converter 13C, and photoelectric converter 13D. The four charge accumulation regions 41 included in the sub-pixels A through D will be written as charge accumulation region 41A, charge accumulation region 41B, charge accumulation region 41C, and charge accumulation region 41D.

The photoelectric converter 13A handles imaging with regard to elements having positive values in the first filter ((a) in FIG. 18), the photoelectric converter 13B handles imaging with regard to elements having negative values in the first filter ((a) in FIG. 18), the photoelectric converter 13C handles imaging with regard to elements having positive values in the second filter ((b) in FIG. 18), and the photoelectric converter 13D handles imaging with regard to elements having negative values in the second filter ((b) in FIG. 18). However, it is self-evident that allocations of roles other than these can be made.

An example of the imaging device 101 where sensitivity can be individually set for each of the plurality of photoelectric converters 13 included in one pixel cell 10A is a configuration where the voltage of the pixel electrode 11 side or third electrode of the layered imaging device is controlled, as described above. Imaging devices capable of setting individual sensitivity for each photoelectric converter 13, that use selection transistors do not readily yield isochronicity at the time of changing sensitivity. A method of application even in a case where isochronicity is not obtained will be described in the present embodiment.

Figure 23:
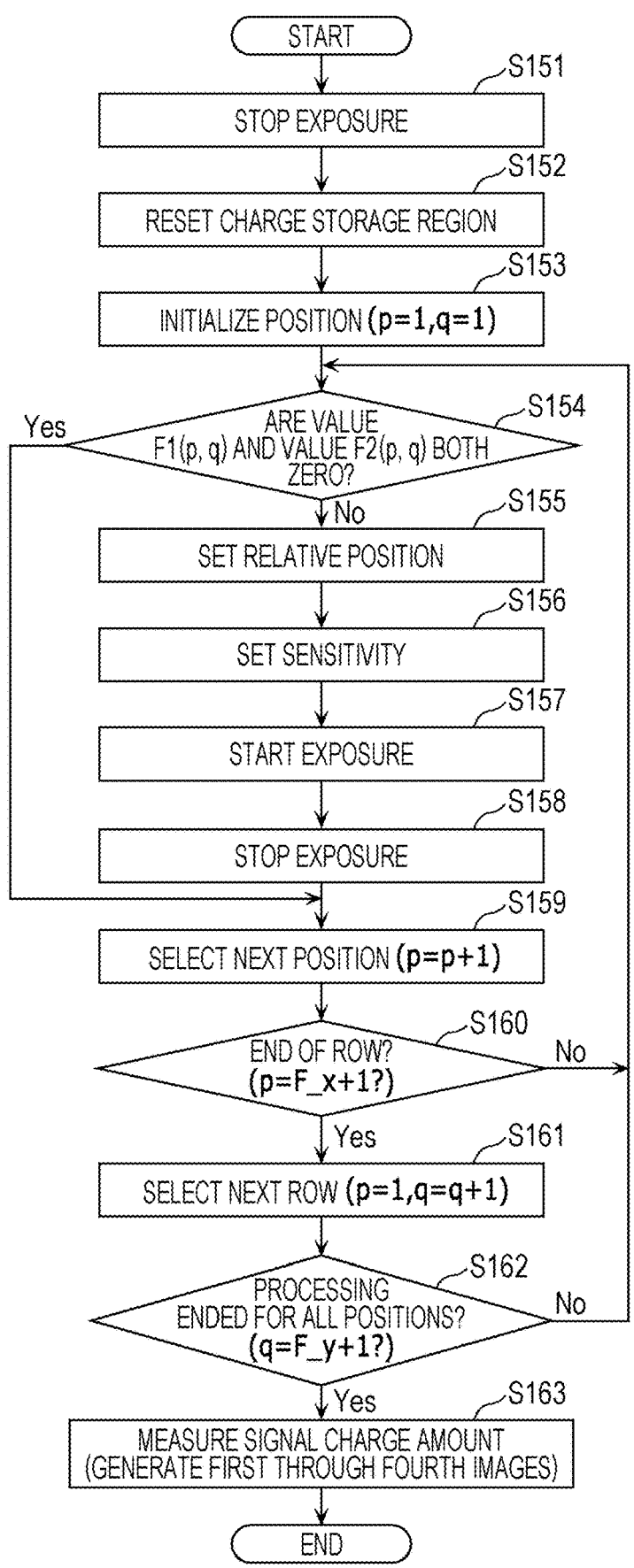
FIG. 23 is a flowchart illustrating imaging procedures according to the fourth embodiment.

FIG. 23 is a flowchart of an imaging method by the imaging system 100 according to the present embodiment. The processing of steps S151 through S153 is the same as the processing in steps S111 through S113 illustrated in FIG. 13. However, in a case where isochronicity cannot be obtained at the time of changing sensitivity, stopping exposure by setting sensitivity to 0 is desirably avoided. That is to say, exposure is desirably stopped by the mechanical shutter 107 in the present embodiment.

In step S154, the imaging system 100 determines whether the filter coefficient values F1(p, q) and F2(p, q) both are zero. In a case where the value F1(p, q) and value F2(p, q) both are zero (Yes in S154), the flow transitions to step S159.

In a case where the value F1(p, q) and value F2(p, q) are not both zero (No in S154), the imaging system 100 sets the relative position of the image of the subject and the imaging device 101 in the same way as in step S115 (S155). Specifically, the position setting circuit 105 controls the position setting unit 103 so that the relative position will be (C_x–p, q–C_y).

Next, the sensitivity setting circuit 104 sets the sensitivities of the sub-pixels A through D (S156). Specifically, the sensitivity setting circuit 104 performs settings of sensitivity in accordance with whether F1(p, q) and F2(p, q) are positive, negative, or zero.

More specifically, if F1(p, q) is positive, the sensitivity setting circuit 104 sets the sensitivity of the photoelectric converter 13A to |(reference sensitivity)×F1(p, q)|. If F1(p, q) is negative, the sensitivity setting circuit 104 sets the sensitivity of the photoelectric converter 13A to 0. If F1(p, q) is 0, the sensitivity setting circuit 104 sets the sensitivity of the photoelectric converter 13A to 0.

If F1(p, q) is positive, the sensitivity setting circuit 104 sets the sensitivity of the photoelectric converter 13B to 0. If F1(p, q) is negative, the sensitivity setting circuit 104 sets the sensitivity of the photoelectric converter 13B to |(reference sensitivity)×F1(p, q)|. If F1(p, q) is 0, the sensitivity setting circuit 104 sets the sensitivity of the photoelectric converter 13B to 0.

If F2(p, q) is positive, the sensitivity setting circuit 104 sets the sensitivity of the photoelectric converter 13C to |(reference sensitivity)×F2(p, q)|. If F2(p, q) is negative, the sensitivity setting circuit 104 sets the sensitivity of the photoelectric converter 13C to 0. If F2(p, q) is 0, the sensitivity setting circuit 104 sets the sensitivity of the photoelectric converter 13C to 0.

If F2(p, q) is positive, the sensitivity setting circuit 104 sets the sensitivity of the photoelectric converter 13D to 0. If F2(p, q) is negative, the sensitivity setting circuit 104 sets the sensitivity of the photoelectric converter 13D to |(reference sensitivity)×F2(p, q)|. If F2(p, q) is 0, the sensitivity setting circuit 104 sets the sensitivity of the photoelectric converter 13D to 0.

Next, the imaging system 100 starts exposure (S157). Note that the processing of steps S157 through S163 is the same as the processing of steps S117 through S123 illustrated in FIG. 13.

According to the above processing, there are generated a first image corresponding to elements in the first filter having positive values, a second image corresponding to elements in the first filter having negative values, a third image corresponding to elements in the second filter having positive values, and a fourth image corresponding to elements in the second filter having negative values. The generated first through fourth images are stored in the storage region.

The computing circuit 108 then subtracts the second image from the first image, thereby generating an image equivalent to the results of convolution using the first filter. The computing circuit 108 also subtracts the fourth image from the third image, thereby generating an image equivalent to the results of convolution using the second filter.

As described above, convolution imaging on a plurality of filters can be performed at once if a plurality of pixel cells 10A each have a plurality of photoelectric converters 13, and the sensitivity of each photoelectric converter 13 of one pixel cell 10A can be individually changed.

FIG. 24 is a diagram schematically illustrating the flow of an imaging method according to the present embodiment. FIG. 24 illustrates an example of a case of performing convolution shooting corresponding to the first filter illustrated in (a) in FIG. 18 and the second filter illustrated in (b) in FIG. 18. Note that while there are no positions of elements of which the value is not 0 in the multiple elements of the first filter that overlay positions of elements of which the value is not 0 in the multiple elements of the second filter, these positions may be overlaid.

First, the upper left (p=1, q=1) is selected as the position of interest, and the relative position is set to (1, −1), as illustrated in FIG. 24. The coefficient at the upper left of the first filter is 1, and the coefficient at the upper left of the second filter is 0, so the sensitivity of the sub-pixel A corresponding to the element having the positive value in the first filter is set to 1, and the sensitivities of the other sub-pixels B through D are set to zero. Exposure is performed in this state. Next, the upper middle (p=2, q=1) is selected as the position of interest, and the relative position is set to (0, −1). The coefficient at the upper middle of the first filter is 0, and the coefficient at the upper middle of the second filter is −1, so the sensitivity of the sub-pixel D corresponding to the element having the negative value in the second filter is set to 1, and the sensitivities of the other sub-pixels A through C are set to zero. Exposure is then performed in this state.

Processing is thereafter performed in the same way. Note that the coefficients of the first filter and second filter are both zero at the middle position (p=2, q=2), so exposure is skipped.

As described above, in the imaging system 100 according to the present embodiment, each of the plurality of pixel cells 10A includes a first sub-pixel and a second sub-pixel. The first sub-pixel and second sub-pixel each include a photoelectric converter 13 and charge accumulation region 41. The sensitivity setting circuit 104 independently sets the sensitivity of the plurality of first sub-pixels and the sensitivity of the plurality of second sub-pixels included in the plurality of pixel cells 10A. Accordingly, the imaging system 100 can generated a plurality of images obtained by different convolution computations at the same time.

In the imaging method according to the present embodiment, in an N count of setting steps, sensitivity of a plurality of first sub-pixels and sensitivity of a plurality of second sub-pixels are set to different values. In a computing step, one or more images obtained from the plurality of first sub-pixels in the N count of accumulation steps are used to obtain a first image equivalent to an image after predetermined first convolution processing. Also, in the computing step, one or more images obtained from the plurality of second sub-pixels in the N count of accumulation steps are used to obtain a second image equivalent to an image after predetermined second convolution processing that is different from the first convolution processing. Accordingly, this imaging method can generate a plurality of images obtained by different convolution computation at the same time.

Although an imaging apparatus according to the present embodiment has been described, the present disclosure is not restricted to this embodiment. For example, an example has been described where the exposure time is constant for each exposure in multiple exposure, but the exposure time may be changed in addition to changing the sensitivity. The amount of signal charges accumulated at the charge accumulation region 41 is proportionate to the sensitivity and exposure time. For example, in a case where the sensitivity is set to double the reference sensitivity, and the exposure time is set to double a reference exposure time, the amount of signal charges will be four times a case where the sensitivity is the reference sensitivity and the exposure time is the reference exposure time. That is to say, in a case where the amount of signal charges in a case where the sensitivity is set to the reference sensitivity and the exposure time is set to the reference exposure time corresponds to filter coefficient value 1, exposure can be realized corresponding to filter coefficient value 4 by doubling the sensitivity from the reference sensitivity and doubling the exposure time from the reference exposure time. Thus, by changing the exposure time in addition to sensitivity, a broader range of filter coefficients can be handled while suppressing increase in the types of sensitivity used.

An example has been described where the exposure time is constant for each exposure in multiple exposure, but the exposure time may be changed for each exposure. For example, in a case where the range of absolute values that filter coefficients can assume is integers in the range of 0 to 100, the above-described filter coefficients can be realized by a combination of sensitivity and exposure time, where the sensitivity setting range is {reference sensitivity, two times reference sensitivity, . . . , 10 times reference sensitivity}, from the combination of sensitivity and exposure time. That is to say, the product of sensitivity and exposure time corresponds to the filter coefficient value.

In a case of performing the same sensitivity changing at all pixels as described in the first embodiment for example, changing exposure time is easily applied. The same advantages can be obtained by keeping the sensitivity constant and changing the exposure time instead of changing the sensitivity. However, it is easier to change the sensitivity for each pixel than to change the exposure time for each pixel. Accordingly, in a case of performing imaging for convolution with a plurality of filters at the same time, the method of changing sensitivity is desirable.

Although the configuration illustrated in FIG. 9 has been described as an imaging device 101 of which the sensitivity is variable, but another imaging device 101 having variable sensitivity may be used. For example, an example of an imaging device 101 of which the sensitivity is variable is an image-intensifier charge-coupled device (ICCD). An ICCD is a device that generates electrons by incident light to the imaging device, amplifies the generated electrons at a microchannel plate or the like, and measures the obtained signals at a CCD. Changing the voltage applied to the microchannel plate enables sensitivity to be changed. For example, setting the voltage to 0 enables the sensitivity to be substantially 0. However, ICCDs require high voltage to drive the microchannel plate. The structure is also complicated and difficult to miniaturize.

Another example of an imaging device 101 of which the sensitivity is variable is an imaging device where avalanche photodiodes are integrated. Changing the bias voltage of the avalanche photodiodes enables the avalanche amplification to be changed and change the sensitivity. However, avalanche photodiodes also require high voltage to drive.

The divisions of functional blocks in the block diagrams are exemplary, and a plurality of functional blocks may be realized as a single functional block, a single functional block may be divided into two or more elements, and a part of functions may be moved to a different functional block.

For example, although the imaging device 101 and the computing circuit 108 are shown as separate blocks in FIG. 7, the computing circuit 108 may be included in an integrated circuit (e.g., image sensor) including the imaging device 101. Alternatively, the computing circuit 108 may be included in a signal processing circuit realized by a microprocessor such as a digital signal processor (DSP). The sensitivity setting circuit 104, position setting circuit 105, and synchronization circuit 106 make up control circuitry. That is to say, the sensitivity setting circuit 104, position setting circuit 105, and synchronization circuit 106 are realized by the control circuitry. This control circuitry executes the processing described with reference to FIGS. 12 through 21, 23, and 24, by controlling the components of the imaging system 100. This control circuitry may be configured of one integrated circuit, or may be configured of a plurality of circuits. The imaging system 100 may further include memory storing a program for executing the processing described with reference to FIGS. 12 through 21, 23, and 24. The control circuitry may read out the program stored in memory, and execute processing following the program read out.

The processing units included in the imaging device according to the above-described embodiments typically are realized as large scale integration (LSI) circuits that are integrated circuits. These may be individually formed into one chip, or part or all may be included in one chip.

Circuit integration is not restricted to LSIs, and dedicated circuits or general-purpose processors may be used to realize the same. A field programmable gate array (FPGA) which can be programmed after manufacturing the LSI, or a reconfigurable processor where circuit cell connections and settings within the LSI can be reconfigured, may be used.

Although an imaging apparatus according to one or multiple forms have been described by way of embodiments, the present disclosure is not restricted to these embodiments. Modifications conceivable by one skilled in the art made to the embodiments, and forms constructed by combining components of different embodiments, without departing from the essence of the present disclosure, may also be included in the scope of one or multiple forms.

The imaging system and imaging method according to the present disclosure is capable of obtaining images in which convolution has been performed at high speed. Accordingly, the imaging system and imaging method according to the present disclosure is useful for deep learning processing that requires great amounts of convolution processing. Particularly, the usefulness is high in cases where on-the-fly deep learning processing is required, such as in self-driving and so forth.

What is claimed is:

1. An imaging system, comprising:
   an imaging optical system that images an image of a subject;
   an imaging device including a plurality of pixel cells;
   an actuator that changes a relative position of the plurality of pixel cells and the image of the subject; and
   control circuitry that controls the imaging device and the actuator,
   wherein the plurality of pixel cells each have variable sensitivity,
   wherein the plurality of pixel cells each include
      a photoelectric converter that converts light of the image of the subject into a signal charge, and
      a charge accumulation region that accumulates the signal charge obtained at the photoelectric converter,
   and wherein the control circuitry
      sets the relative position to a first position, and also sets the sensitivity of each of the plurality of pixel cells to a first sensitivity, to cause a first signal charge obtained at the photoelectric converter to be accumulated in the charge accumulation region in each of the plurality of pixel cells, and
      sets the relative position to a second position that is different from the first position, and also sets the sensitivity of each of the plurality of pixel cells to a second sensitivity that is different from the first sensitivity, to cause a second signal charge obtained at the photoelectric converter to be accumulated in the charge accumulation region in each of the plurality of pixel cells in addition to the first signal charge.

2. The imaging system according to claim 1,
   wherein the control circuitry
      synchronously performs the setting of the relative position to the first position, and the setting of the sensitivity of each of the plurality of pixel cells to the first sensitivity, and
      synchronously performs the setting of the relative position to the second position, and the setting of the sensitivity of each of the plurality of pixel cells to the second sensitivity.

3. The imaging system according to claim 1,
   wherein the control circuitry performs the setting to the second position by changing the relative position from the first position to the second position by an integer multiple of a center-to-center distance between two adjacent pixel cells out of the plurality of pixel cells.

4. An imaging system, comprising:
   an imaging optical system that images an image of a subject;
   an imaging device including a plurality of pixel cells;
   an actuator that changes a relative position of the plurality of pixel cells and the image of the subject; and
   control circuitry that controls the imaging device and the actuator,
   wherein the plurality of pixel cells each have variable sensitivity,
   wherein the plurality of pixel cells each include
      a photoelectric converter that converts light of the image of the subject into a signal charge, and
      a charge accumulation region that accumulates the signal charge obtained at the photoelectric converter,
   and wherein, during one exposure period, the control circuitry changes the relative position from a first position to a second position that is different from the first position, and changes the sensitivity of each of the plurality of pixel cells from a first sensitivity to a second sensitivity that is different from the first sensitivity, to cause a third signal charge obtained at the photoelectric converter to be accumulated at the charge accumulation region, in each of the plurality of pixel cells.

5. The imaging system according to claim 4,
   wherein the control circuitry changes the relative position from the first position to the second position in a continuous manner.

6. The imaging system according to claim 4,
   wherein the control circuitry changes the sensitivity of each of the plurality of pixel cells from the first sensitivity to the second sensitivity in a continuous manner.

7. The imaging system according to claim 4,
   wherein the control circuitry performs the changing of the relative position and the changing of the sensitivity of each of the plurality of pixel cells in a synchronous manner.

8. The imaging system according to claim 1,
   wherein the plurality of pixel cells are laid out two-dimensionally in a row direction and a column direction.

9. The imaging system according to claim 1,
   wherein the control circuitry performs the setting of the sensitivity of each of the plurality of pixel cells all at once.

10. The imaging system according to claim 1,
    wherein each of the plurality of pixel cells includes a first sub-pixel and a second sub-pixel,
    wherein the first sub-pixel of each of the plurality of pixel cells includes the photoelectric converter and the charge accumulation region,
    wherein the sensitivity of each of the plurality of pixel cells is the sensitivity of the first sub-pixel,
    wherein the second sub-pixel of each of the plurality of pixel cells includes a second photoelectric converter and a second charge accumulation region,
    and wherein the control circuitry sets or changes sensitivity of the second sub-pixel independently from the sensitivity of the first sub-pixel in each of the plurality of pixel cells.

11. The imaging system according to claim 1,
    wherein the photoelectric converter of each of the plurality of pixel cells includes:
       a pixel electrode connected to the charge accumulation region;
       an opposing electrode that transmits light; and
       a photoelectric conversion layer disposed between the pixel electrode and the opposing electrode.

12. The imaging system according to claim 11,
    wherein the imaging device further includes
       a voltage applying circuit that applies voltage across the pixel electrode and the opposing electrode included in the photoelectric converter of each of the plurality of pixel cells,
    and wherein the control circuitry changes the sensitivity of each of the plurality of pixel cells by changing the voltage that the voltage applying circuit applies.

13. An imaging method in an imaging system, the imaging system comprising: an imaging optical system that images an image of a subject; an imaging device including a plurality of pixel cells; an actuator that changes a relative position of the plurality of pixel cells and the image of the subject; and control circuitry that controls the imaging device and the actuator, wherein the plurality of pixel cells each have variable sensitivity, and the plurality of pixel cells each include: a photoelectric converter that converts light of the image of the subject into a signal charge; and a charge accumulation region that accumulates the signal charge obtained at the photoelectric converter, the imaging method comprising:

setting the relative position to a first position;

setting the sensitivity of each of the plurality of pixel cells to a first sensitivity;

causing a first signal charge obtained at the photoelectric converter to be accumulated in the charge accumulation region in each of the plurality of pixel cells in a state where the relative position is set to the first position and the sensitivity of each of the plurality of pixel cells set to the first sensitivity;

setting the relative position to a second position that is different from the first position;

setting the sensitivity of each of the plurality of pixel cells to a second sensitivity that is different from the first sensitivity; and causing a second signal charge obtained at the photoelectric converter to be accumulated in the charge accumulation region in each of the plurality of pixel cells in addition to the first signal charge, in a state where the relative position is set to the second position and the sensitivity of each of the plurality of pixel cells set to the second sensitivity.

14. The imaging method according to claim 13, wherein the setting to the second position is performed by changing the relative position from the first position to the second position by an integer multiple of a center-to-center distance between two adjacent pixel cells out of the plurality of pixel cells.

15. The imaging method according to claim 13, wherein the imaging system further comprises a mechanical shutter that shields imaging device from light, and wherein the setting to the second position is performed by changing the relative position from the first position to the second position in a state where the imaging device is shielded from light by the mechanical shutter.

16. The imaging method according to claim 13, wherein the setting to the second position is performed by changing the relative position from the first position to the second position in a state where the sensitivity of each of the plurality of pixel cells set to zero.

17. The imaging method according to claim 13, further comprising:

performing an N count (where N is an integer of 2 or greater) of settings of the relative position, including the setting to the first position and the setting to the second position, in which the relative position is set to an i'th (where i is an integer of 1 to N) position in an i'th setting of the relative position;

performing an N count of settings of the sensitivity, including the setting to the first sensitivity and the setting to the second sensitivity, in which the sensitivity of each of the plurality of pixel cells is set to an i'th sensitivity in an i'th setting of the sensitivity;

performing an N count of accumulations, including the accumulation of the first signal charge and the accumulation of the second signal charge, in which the i'th signal charge obtained at the photoelectric converter is accumulated at the charge accumulation region at each of the plurality of pixel cells in a state where the relative position is set to the i'th position and the sensitivity of each of the plurality of pixel cells is set to the i'th sensitivity at the i'th accumulation; and obtaining a piece of image data using one or more pieces of image data obtained by the N count of the accumulations, the piece of image data being equivalent to a piece of image data obtainable by predetermined first convolution processing, wherein the i'th position corresponds to a position of an i'th coefficient included in an N count of coefficients out of a plurality of coefficients in the first convolution processing, and wherein the i'th sensitivity corresponds to the value of the i'th coefficient.

18. The imaging method according to claim 17, wherein the one or more pieces of image data includes a first piece of image data and a second piece of image data, wherein the N is an integer of 3 or greater, wherein the N count of coefficients is made up of an M (wherein M is an integer of 1 or greater but smaller than N) count of coefficients having a positive value, and an (N−M) count of coefficients having a negative value, wherein the first piece of image data corresponds to a sum value of signal charges accumulated in the charge accumulation region of each of the plurality of pixel cells, by the M count of accumulations corresponding to the M count of coefficients, wherein the second piece of image data corresponds to a sum value of signal charges accumulated in the charge accumulation region of each of the plurality of pixel cells, by an (N−M) count of accumulations corresponding to the (N−M) count of negative coefficients, and wherein the piece of image data equivalent to the piece of image data obtainable by the first convolution processing is obtained by subtracting the second piece of image data from the first piece of image data.

19. The imaging method according to claim 13, further comprising:

performing an N count (where N is an integer of 4 or greater) of settings of the relative position, including the setting to the first position and the setting to the second position, in which the relative position is set to an i'th (where i is an integer of 1 to N) position in an i'th setting of the relative position;

performing an N count of settings of the sensitivity, including the setting to the first sensitivity and the setting to the second sensitivity, in which the sensitivity of each of the plurality of pixel cells is set to an i'th sensitivity in an i'th setting of the sensitivity;

performing an N count of accumulations, including the accumulation of the first signal charge and the accumulation of the second signal charge, in which the i'th signal charge obtained at the photoelectric converter is accumulated at the charge accumulation region at each of the plurality of pixel cells in a state where the relative position is set to the i'th position and the sensitivity of each of the plurality of pixel cells is set to the i'th sensitivity at the i'th accumulation;

performing a setting to a sensitivity corresponding to a sum value of an offset value and one of a plurality of coefficients of predetermined first convolution processing, in each of an M (wherein M is an integer of 2 or greater but smaller than N) counts of settings, out of the N counts of settings of the sensitivity;

performing a setting to sensitivity corresponding to the offset value in each of the (N−M) count of settings, out of the N counts of settings of the sensitivity;

obtaining a first piece of image data by an M count of accumulations corresponding to the M count of settings of the sensitivity, the first piece of image data being equivalent to a piece of image data obtainable by convolution processing using a plurality of coefficients obtainable by adding an offset value to all coefficients of the first convolution processing;

obtaining a second piece of image data by an (N−M) count of accumulations corresponding to the (N−M) count of settings of the sensitivity, the second piece of image data being equivalent to a piece of image data obtainable by convolution processing using the offset value as all coefficients; and obtaining a piece of image data by subtracting the second piece of image data from the first piece of image data, the piece of image data being equivalent to a piece of image data obtainable by the first convolution processing.

20. The imaging method according to claim 17, wherein the value of the N count of coefficients used for the N count of settings of the sensitivity is not 0.

21. The imaging method according to claim 17, further comprising:

obtaining a piece of image data equivalent to a piece of image data obtainable by second convolution processing that is different from the first convolution processing, wherein each of the plurality of pixel cells includes a first sub-pixel and a second sub-pixel, wherein the first sub-pixel of each of the plurality of pixel cells includes the photoelectric converter and the charge accumulation region, wherein the sensitivity of each of the plurality of pixel cells is sensitivity of the first sub-pixel, wherein the second sub-pixel of each of the plurality of pixel cells includes a second photoelectric converter and a second charge accumulation region, wherein, in each of the N count of settings of the sensitivity, sensitivity of the second sub-pixel in each of the plurality of pixel cells is further set, wherein, in at least one of the N count of settings of the sensitivity, a setting value of the sensitivity of the first sub-pixel is different from a setting value of the sensitivity of the second sub-pixel, wherein in each of the N count of accumulations, a signal charge obtained at the second photoelectric converter of the second sub-pixel is accumulated in the second charge accumulation region, in each of the plurality of pixel cells, and wherein the piece of image data equivalent to the piece of image data obtainable by the first convolution processing is obtained using one or more pieces of image data obtained by the plurality of first sub-pixels by the N count of accumulations, and the piece of image data equivalent to the piece of image data obtainable by the second convolution processing is obtained using one or more other images obtained by the plurality of second sub-pixels by the N count of accumulations.

22. The imaging method according to claim 13, further comprising:

performing an N count (where N is an integer of 2 or greater) of settings of the relative position, including the setting to the first position and the setting to the second position, in which the relative position is set to an i'th (where i is an integer of 1 to N) position in an i'th setting of the relative position;

performing an N count of settings of the sensitivity, including the setting to the first sensitivity and the setting to the second sensitivity, in which the sensitivity of each of the plurality of pixel cells is set to an i'th sensitivity in an i'th setting of the sensitivity, and the exposure time is set to an i'th exposure time;

performing an N count of accumulations, including the accumulation of the first signal charge and the accumulation of the second signal charge, in which the i'th signal charge obtained at the photoelectric converter in the i'th exposure time is accumulated at the charge accumulation region at each of the plurality of pixel cells in a state where the relative position is set to the i'th position and the sensitivity of each of the plurality of pixel cells is set to the i'th sensitivity at the i'th accumulation; and obtaining a piece of image data using one or more pieces of image data obtained by the N count of the accumulations, the piece of image data being equivalent to a piece of image data obtainable by predetermined first convolution processing.

23. An imaging method in an imaging system, the imaging system comprising: an imaging optical system that images an image of a subject; an imaging device including a plurality of pixel cells; an actuator that changes a relative position of the plurality of pixel cells and the image of the subject; and control circuitry that controls the imaging device and the actuator, wherein the plurality of pixel cells each have variable sensitivity, and the plurality of pixel cells each include: a photoelectric converter that converts light of the image of the subject into a signal charge; and a charge accumulation region that accumulates the signal charge obtained at the photoelectric converter, the imaging method comprising:

performing, during one exposure period,
changing the relative position from a first position to a second position that is different from the first position;
changing the sensitivity of each of the plurality of pixel cells from a first sensitivity to a second sensitivity that is different from the first sensitivity; and
causing a third signal charge obtained at the photoelectric converter to be accumulated at the charge accumulation region, in each of the plurality of pixel cells.

24. The imaging method according to claim 23, wherein the relative position is changed from the first position to the second position in a continuous manner.

25. The imaging system according to claim 23, wherein the sensitivity of each of the plurality of pixel cells is changed from the first sensitivity to the second sensitivity in a continuous manner.

* * * * *